(12) United States Patent
Cho et al.

(10) Patent No.: US 9,999,139 B2
(45) Date of Patent: Jun. 12, 2018

(54) MULTILAYER THIN FILM, METHOD OF MANUFACTURING THE SAME, AND ELECTRONIC PRODUCT INCLUDING THE SAME

(71) Applicant: SAMSUNG ELECTRONICS CO., LTD., Suwon-si (KR)

(72) Inventors: Jin Hyun Cho, Seoul (KR); Hyong Jun Yoo, Hwaseong-si (KR); Seo Joon Lee, Suwon-si (KR); Min Chul Jung, Pyeongtaek-si (KR); Hyun Jun Jung, Yongin-si (KR)

(73) Assignee: SAMSUNG ELECTRONICS CO., LTD., Suwon-si (KR)

(\*) Notice: Subject to any disclaimer, the term of this patent is extended or adjusted under 35 U.S.C. 154(b) by 110 days.

(21) Appl. No.: 14/972,530

(22) Filed: Dec. 17, 2015

(65) Prior Publication Data

US 2016/0205788 A1    Jul. 14, 2016

(30) Foreign Application Priority Data

Jan. 8, 2015 (KR) .................. 10-2015-0002476

(51) Int. Cl.
*H05K 3/46* (2006.01)
*C23C 14/34* (2006.01)
(Continued)

(52) U.S. Cl.
CPC .......... *H05K 3/46* (2013.01); *C23C 14/0015* (2013.01); *C23C 14/0042* (2013.01); *C23C 14/0641* (2013.01); *C23C 14/08* (2013.01); *C23C 14/205* (2013.01); *C23C 14/34* (2013.01); *C23C 14/352* (2013.01); *C23C 28/322* (2013.01); *C23C 28/34* (2013.01); *C23C 28/345* (2013.01); *H04M 1/0283* (2013.01); *H05K 3/0041* (2013.01);
(Continued)

(58) Field of Classification Search
None
See application file for complete search history.

(56) References Cited

U.S. PATENT DOCUMENTS

| 6,410,986 B1 | 6/2002 | Merchant et al. |
| 2007/0116965 A1* | 5/2007 | Medwick ................ C03C 17/36 |
| | | 428/426 |

(Continued)

FOREIGN PATENT DOCUMENTS

| KR | 10-2010-0002365 A | 1/2010 |
| KR | 10-2014-0142122 A | 12/2014 |

(Continued)

OTHER PUBLICATIONS

Communication dated Jun. 14, 2016, from the European Patent Office in counterpart European Application No. 15200046.9.

(Continued)

*Primary Examiner* — John J Figueroa
(74) *Attorney, Agent, or Firm* — Sughrue Mion, PLLC

(57) ABSTRACT

A multilayer thin film and a method of depositing a multilayer thin film on a surface of a product is provided. The multilayer thin film includes a first layer including a non-conductive material coupled to an object, a second layer including a metallic material coupled to the first layer, and a third layer including a non-conductive material coupled to the second layer.

18 Claims, 23 Drawing Sheets

(51) Int. Cl.
| | |
|---|---|
| *H05K 3/00* | (2006.01) |
| *C23C 14/00* | (2006.01) |
| *C23C 14/06* | (2006.01) |
| *C23C 14/08* | (2006.01) |
| *C23C 14/20* | (2006.01) |
| *C23C 14/35* | (2006.01) |
| *C23C 28/00* | (2006.01) |
| *H04M 1/02* | (2006.01) |

(52) U.S. Cl.
 CPC . *H05K 2203/085* (2013.01); *H05K 2203/095* (2013.01)

(56) References Cited

U.S. PATENT DOCUMENTS

| | | |
|---|---|---|
| 2012/0161591 A1 | 6/2012 | Wang et al. |
| 2012/0171508 A1 | 7/2012 | Chang et al. |
| 2014/0355183 A1* | 12/2014 | Cho .................. C23C 14/0015 361/679.01 |
| 2014/0377483 A1 | 12/2014 | Zhang |

FOREIGN PATENT DOCUMENTS

| | | |
|---|---|---|
| KR | 10-2014-0142123 A | 12/2014 |
| KR | 10-2015-0051250 A | 5/2015 |

OTHER PUBLICATIONS

Communication dated Jan. 18, 2018, issued by the European Patent Office in counterpart European application No. 15 200 046.9.

\* cited by examiner

MULTILAYER THIN FILM, METHOD OF MANUFACTURING THE SAME, AND ELECTRONIC PRODUCT INCLUDING THE SAME

CROSS-REFERENCE TO RELATED APPLICATIONS

This application claims priority to Korean Patent Application No. 10-2015-0002476, filed on Jan. 8, 2015 in the Korean Intellectual Property Office, the disclosure of which is incorporated herein by reference in its entirety.

BACKGROUND

1. Field

Exemplary embodiments of the present disclosure relate to a method of depositing a multilayer thin film on a surface of a product and a product having a multilayer thin film deposited thereon.

2. Description of the Related Art

Metal materials and plastic materials are used as the material for forming the exterior of electronic products. Metal material is difficult to use due to roughness caused by machining, and thus post-processing, e.g. painting, plating and anodizing is required. Multilayer thin film is deposited on metal material by using plasma so that the metal material may be realized in various colors.

Plastic material is lightweight and has a high degree of freedom in comparison with metal material, and thus there are advantages to manufacturing a product having a complex shape out of plastic material, including a low price. In addition, multilayer thin film is deposited on plastic material by using plasma so that the plastic material may be realized in various colors, like as the metal material, and the sense of metal may be realized. In order to realize the sense of metal on the plastic base material, plating, hot stamping, and general painting are usually performed, and in addition, a method of applying metallic paint thinly or a method of applying a semi-transparent resin are mainly performed.

Wireless communication products, e.g., mobile phones, have increased in popularity due to the development of wireless communication. In addition, the popularity of electronic products provided with a number of sensors has also increased. Electronic products using wireless communication and electronic products provided with a number of sensors may require an exterior thereof formed by a non-conductive material to enhance the wireless communication quality and the sensing quality. However, since non-conductive materials that are configured to be deposited as a multi-layer thin film are limited to Tin, there are limitations in implementing various colors and textures to allow the product to have a non-conductive surface.

SUMMARY

Therefore, it is an aspect of the present disclosure to provide a multilayer thin film having a non-conductive surface, a manufacturing method thereof, and an electronic product having the same.

It is another aspect of the present disclosure to provide a non-conductive multilayer thin film implemented in various colors, a manufacturing method thereof, and an electronic product having the same.

It is another aspect of the present disclosure to provide a multilayer thin film having an improved structure configured to have a non-conductive surface and configured to be deposited by using plasma, a manufacturing method thereof, and an electronic product having the same.

Additional aspects of the disclosure will be set forth in part in the description which follows and, in part, will be obvious from the description, or may be learned by practice of the disclosure.

In accordance with one aspect of the present disclosure, a multilayer thin film includes a first layer including a non-conductive material and coupled to an object, a second layer including a metallic material and coupled to the first layer, and a third layer including a non-conductive material and coupled to the second layer. The first layer may include at least one selected from a group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

The third layer may include at least one selected from a group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

The second layer may include at least one selected from a group consisting of aluminum (Al), chromium (Cr), titanium (Ti), and silicon (Si).

The first layer, the second layer, and the third layer may be deposited by being plasma-processed, respectively.

In accordance with another aspect of the present disclosure, a method of manufacturing a multilayer thin film includes depositing a first layer having non-conductive on an object to be deposited, depositing a second layer having metal features on the first layer, and depositing a third layer having non-conductive on the second layer.

The deposition of the first layer having non-conductive on the object to be deposited may include providing a target sample including at least one selected from a group consisting of aluminum (Al), chromium (Cr), titanium (Ti), and silicon (Si), injecting a reaction gas including nitrogen ($N_2$) and oxygen ($O_2$), applying a power source to a multilayer thin film manufacturing device, and reacting the target sample with the reaction gas.

The deposition of a second layer having metal features on the first layer may include providing a target sample including at least one selected from a group consisting of aluminum (Al), chromium (Cr), titanium (Ti), and silicon (Si) and applying a power source to the multilayer thin film manufacturing device.

The deposition of a third layer having non-conductive on the second layer may include providing a target sample including at least one selected from a group consisting of aluminum (Al), chromium (Cr), titanium (Ti), and silicon (Si), injecting a reaction gas including nitrogen ($N_2$) and oxygen ($O_2$), applying a power source to the multilayer thin film manufacturing device, and reacting the target sample with the reaction gas.

The method of manufacturing a multilayer thin film may further include modifying a surface of the object to be deposited by a plasma treatment, when the object to be deposited is a plastic material.

The modification of a surface of the object to be deposited by a plasma treatment may be performed prior to the deposition of the first layer on the object to be deposited.

It is another aspect of the present disclosure to provide an electronic product includes a housing and a multilayer thin film coupled to all or a part of the surface of the housing, wherein the multilayer thin film may include a first layer coupled to the housing, a second layer having metal features and coupled to the first layer, and a third layer coupled to the second layer, wherein the first layer and the third layer may include a non-conductive material.

The first layer may include at least one selected from a group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

The third layer may include at least one selected from a group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

The second layer may include at least one selected from a group consisting of aluminum (Al), chromium (Cr), titanium (Ti), and silicon (Si).

The first layer, the second layer, and the third layer may be deposited by being plasma-processed, respectively.

BRIEF DESCRIPTION OF THE DRAWINGS

These and/or other aspects of the disclosure will become apparent and more readily appreciated from the following description of the exemplary embodiments, taken in conjunction with the accompanying drawings of which.

DETAILED DESCRIPTION

Reference will now be made in detail to exemplary embodiments of the present disclosure, examples of which are illustrated in the accompanying drawings.

According to an exemplary embodiment, a method of manufacturing multilayer thin film may be performed by a multilayer thin film manufacturing device. An object on which a multilayer thin film is deposited may be plastic or metal. Hereinafter for convenience of description, a process of depositing multilayer thin film on a plastic object will be described.

A process of forming multilayer thin film may include modifying a surface of an object by a plasma treatment, and depositing multilayer thin film on the object by using plasma.

The plasma treatment and the deposition of the multilayer thin film may be performed by a sputtering method. It may be understood that the multilayer thin film manufacturing device in the specification includes a sputtering deposition device.

The sputtering method may be a typical physical vapor deposition method. particularly, the sputtering method may be a method in which an inert gas is accelerated and collided with a solid target sample in a vacuum chamber and atoms are ejected from the solid target sample by energy generated during the collision, and the method may be used for forming a metal layer in the form of a thin film to manufacture a semiconductor, a display device, and the like or depositing a metal oxide layer.

Figure 1:
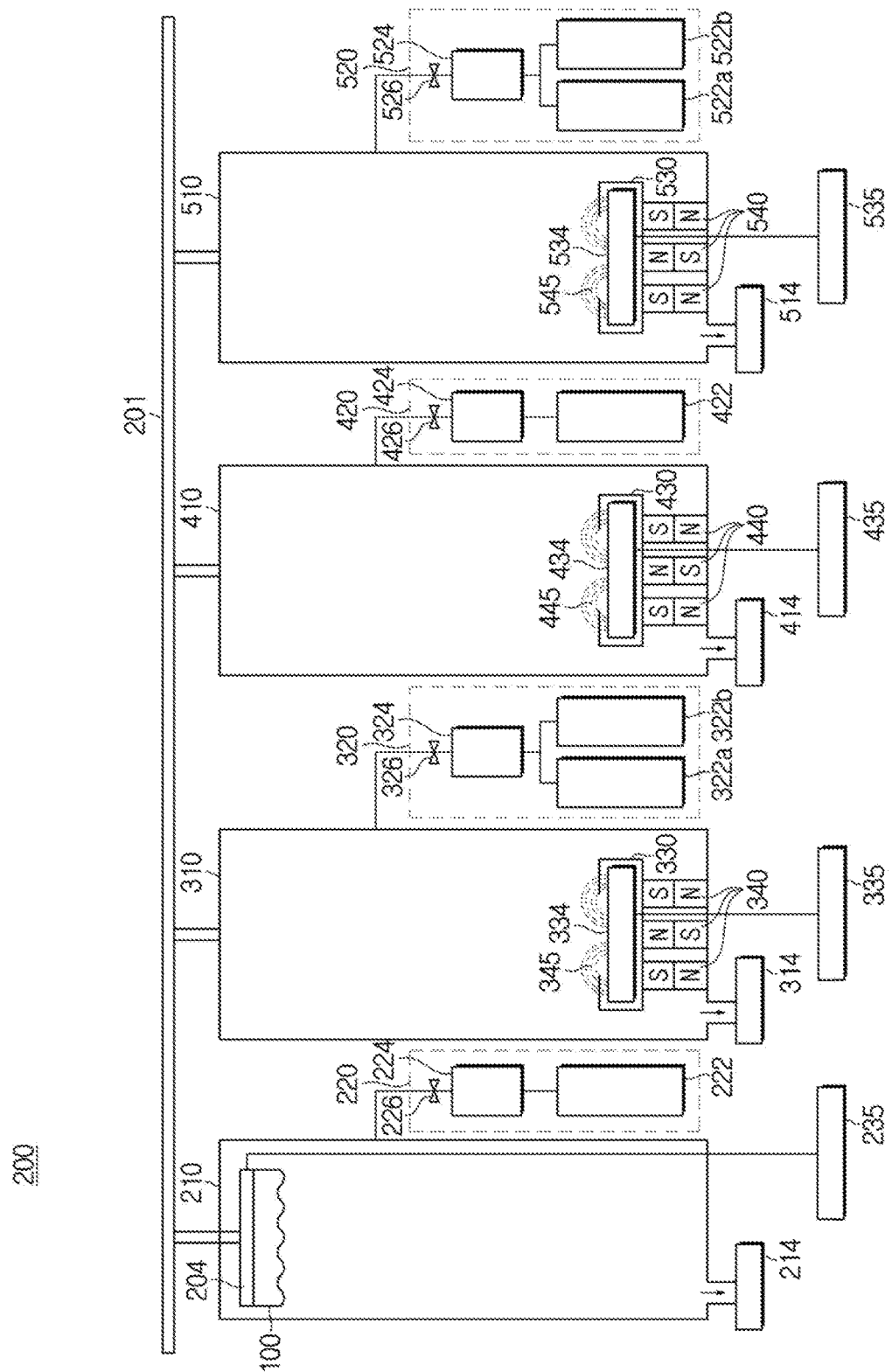
FIG. 1 is a view of an example of a sputtering deposition device configured to perform a method of manufacturing multilayer thin film according to an exemplary embodiment of the present disclosure.

Hereinafter, a configuration of the sputtering deposition device will be described as an example of the multilayer thin film manufacturing device, and then the method of manufacturing the multilayer thin film according to an exemplary embodiment will be described FIG. 1 is a view of an example of a sputtering deposition device 200 configured to perform a method of manufacturing multilayer thin film according to an exemplary embodiment of the present disclosure.

Referring to FIG. 1, the sputtering deposition device 200 may include a plurality of vacuum chambers 210, 310, 410, and 510 vacuum pumps 214, 314, 414, and 514, a plurality of gas supply systems 220, 320, 420, and 520, a rail 201, target samples 334, 434 and 534, guns 330, 430 and 530, and a plurality of magnetrons 340, 440 and 540.

The vacuum pumps 214, 314, 414, and 514 may be provided on side surfaces of the vacuum chambers 210, 310, 410, and 510, respectively, and may maintain the vacuum chambers 210, 310, 410, and 510 in a vacuum state, respectively.

The gas supply systems 220, 320, 420, and 520 may be provided on side walls of the vacuum chambers 210, 310, 410, and 510, respectively, and may supply gas into the vacuum chambers 210, 310, 410, and 510.

The gas supply systems 220, 320, 420, and 520 may include discharge gas chambers 222, 322a, 422, and 522a in which a discharge gas to be ionized is stored, a process gas chamber 322b and 522b in which a nitrogen ($N_2$) gas or an oxygen ($O_2$) gas provided as a process gas for a plasma chemical deposition is stored, mass flow meters 224, 324, 424 and 524 configured to connect the vacuum chambers 210, 310, 410 and 510 to the gas chambers 222, 322a, 322b, 422, 522a and 522b, and control valves 226, 326, 426 and 526 configured to control gas flowing from the gas chambers 222, 322a, 322b, 422, 522a and 522b to the vacuum chambers 210, 310, 410 and 510.

An argon (Ar) gas may be stored in the discharge gas chambers 222, 322a, 422, and 522a and a mixture of other inert gases other than the argon (Ar) gas may also be stored. Hereinafter, for convenience of description, it will be assumed that the argon (Ar) gas is used as the discharge gas.

The rail 201 may be provided at an upper portion of the vacuum chambers 210, 310, 410 and 510, and may move an object to be deposited. Particularly, the object to be deposited may be fixed to a jig 204 and moved along the rail 201.

The object 100 to be deposited may be a part formed of a metal material as well as a plastic material, as illustrated above. In addition, the object 100 may include a curved part or a protruding part other than a planar surface The guns 330, 430 and 530 may be provided inside the vacuum chambers 310, 410 and 510. Since the guns 330, 430 and 530 are connected to cathode through second, third, and fourth power supplies 335, 435 and 535, negative electric fields may be generated and discharged when the second, third and fourth power supplies 335, 435 and 535 supply power to the guns 330, 430 and 530. The argon (Ar) gas may collide with the power supplied from the second, third, and fourth power supplies 335, 435 and 535, and then plasma may be generated while creating an argon ion (Ar+).

The target samples 334, 434, and 534 may be provided inside the vacuum chambers 310, 410 and 510 and may be positioned opposite to the object to be deposited. As described above, the object to be deposited may have a planar shape or a curved shape, and a plurality of target samples 334, 434 and 534 may be used depending on a shape of the object to be deposited.

The magnetrons 340, 440 and 540 may be provided inside the vacuum chambers 310, 410 and 510 and may be installed on a lower portion of the target samples 334, 434 and 534 in plural.

Magnetic fields 345, 445 and 545 are formed by the magnetrons 340, 440 and 540, and thus electrons separated from the argon (Ar) gas move in a spiral path 350, 450, and 550 by simultaneously receiving forces of the magnetic fields 345, 445 and 545 formed by the magnetrons 340, 440 and 540 and the existing electric field. Since the electrons that move in a spiral path are trapped in the magnetic fields 345, 445 and 545, it may be difficult for the electrons to escape, and a density of the electrons in the plasma may be increased. Because of this, ionized argon (Ar+) may be increased in the vacuum chambers 310, 410 and 510, the number of the argon (Ar+) ions colliding with the target samples 334, 434 and 534 may be also increased, and thus the efficiency of a thin film deposition may be improved.

Hereinbefore an example of a configuration of the sputtering deposition device 200 is described.

Hereinafter, a method of manufacturing the multilayer thin film will be described.

The method of manufacturing the multilayer thin film using the multilayer thin film manufacturing device 200 according to an exemplary embodiment may include modifying a surface of the plastic object 100 by a plasma treatment, depositing a first layer 110 on the plastic object 100, and depositing a second layer 120 on the first layer 110, and depositing a third layer 130 on the second layer 120.

The deposition of the first layer 110 on the plastic object 100 may include providing a target sample 334 including at least one selected from a material group consisting of gold (Au), silver (Ag), aluminum (Al), chromium (Cr), titanium (Ti), and tin (Sn), injecting a process gas including nitrogen ($N_2$) and oxygen ($O_2$), applying a power source to the multilayer thin film manufacturing device 200, and reacting the target sample 334 with the process gas.

The deposition of the second layer 120 on the first layer 110 may include providing a target sample 434 including at least one selected from a material group consisting of gold (Au), silver (Ag), aluminum (Al), chromium (Cr), titanium (Ti), and tin (Sn).

The deposition of the third layer 130 on the second layer 120 may include providing a target sample 534 including at least one selected from a material group consisting of gold (Au), silver (Ag), aluminum (Al), chromium (Cr), titanium (Ti), and tin (Sn), injecting a process gas including nitrogen ($N_2$) and oxygen ($O_2$), applying a power source to the multilayer thin film manufacturing device 200, and reacting the target sample 334 with the process gas.

Hereinafter, as an example, the method including the deposition of the first layer 110 including titanium nitride (TiN) on the plastic object 100, the deposition of the second layer 120 including chromium (Cr) on the first layer 110, and the deposition of the third layer including titanium nitride (TiN) on the second layer 120 will be described. During the process, temperatures of the target samples 334, 434 and 534 may be maintained in a range of from a room temperature to 200° C., and a temperature of the object moving along the rail 201, which is to be deposited, may be maintained in a range of 60° C. to 70° C.

Detailed description of the method of manufacturing the multilayer thin film is as follows. FIGS. 2A to 2D are views of a process of performing the method of manufacturing multilayer thin film by the sputtering deposition device 200 illustrated in FIG. 1.

Figure 2A:
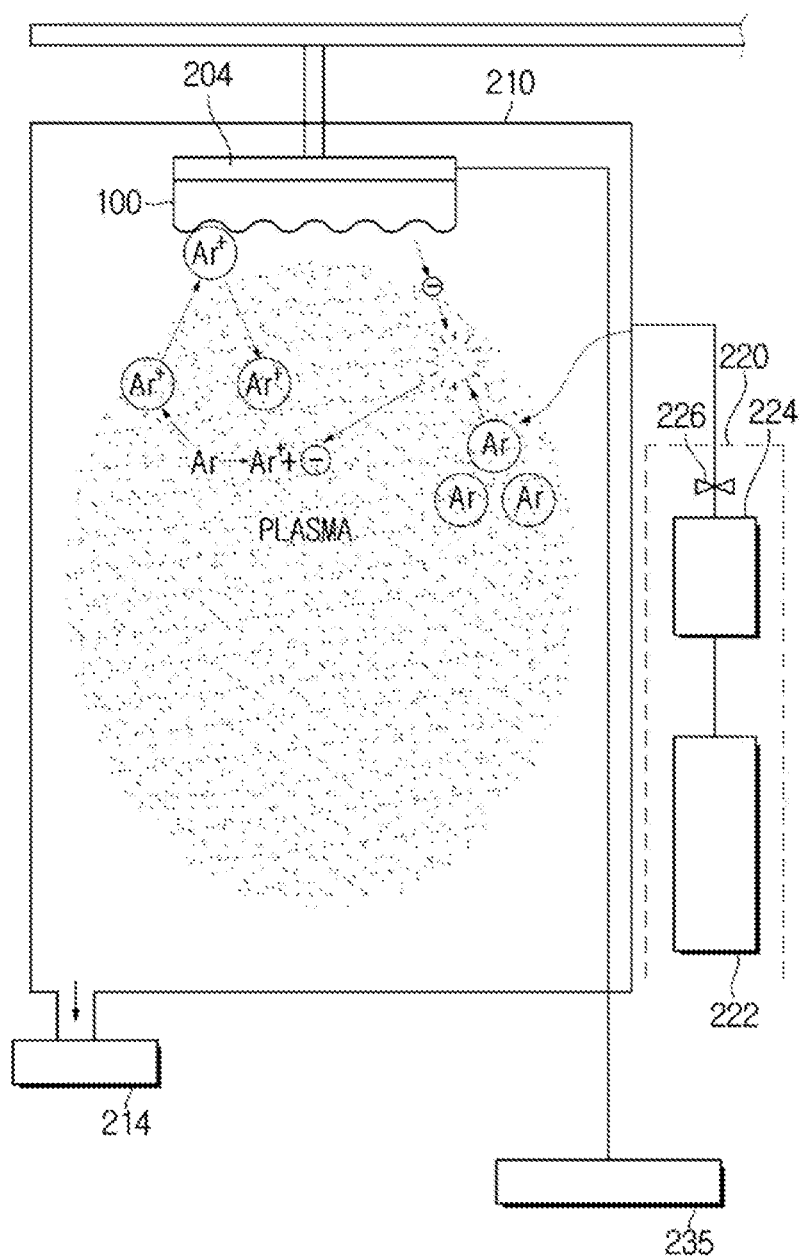
FIGS. 2A, 2B, 2C, and 2D are views of a process of performing the method of manufacturing multilayer thin film by the device of FIG. 1.

Referring to FIG. 2A, the method of manufacturing the multilayer thin film according to an exemplary embodiment may include moving the plastic object 100 to a first vacuum chamber 210 of the sputtering deposition device 200, and modifying the surface of the plastic object 100 through plasma irradiation in an appropriate condition.

In this case, when power is supplied to the gun through a first power supply 235 and then a negative electric field is created, discharging may be started in the first vacuum chamber 210 and plasma may be generated.

Particularly, an argon (Ar) gas injected into the first vacuum chamber 210 is ionized as in the following Reaction Formula 1 by collisions with first and third electrons, and thus the plasma is generated.

$$Ar \rightarrow Ar^+ + e_-$$  Reaction Formula 1

The argon (Ar) gas may be used as a discharge gas and a mixture of other inert gases may also be used. Hereinafter, for convenience of description, it will be assumed that the argon (Ar) gas is used.

The power supply may use a DC power source, a pulsed DC power source, or a radio frequency (RF) power source. The RF power source may be used as the first power supply 235 so that the modifying effect through plasma heating may be maximized while damage of the plastic object 100 is prevented during a plasma treatment.

Particularly, the RF power source continuously changes power applied to a target using a frequency of approximately 13.56 MHz from negative to positive, or from positive to negative. An argon ion (Ar+) in a plasma state is accelerated toward the plastic object 100 when the RF power source is negative, but when trying to attach to the surface after the sputtering, the RF power source is changed to positive and then the argon ion (Ar⁺) is separated from the surface of the plastic object 100. By this principle, the plasma state may be maintained, and thus the RF power source may be used for modifying the plastic object 100 which is non-conductive.

As the surface of the plastic object 100 is modified through the plasma treatment, adhesion of a film to be subsequently formed may be increased, and any foreign substance attached to the surface may be removed.

When the surface modification is completed, the deposition of the multilayer thin film on the plastic object 100 may be performed through the sputtering method.

Figure 2B:
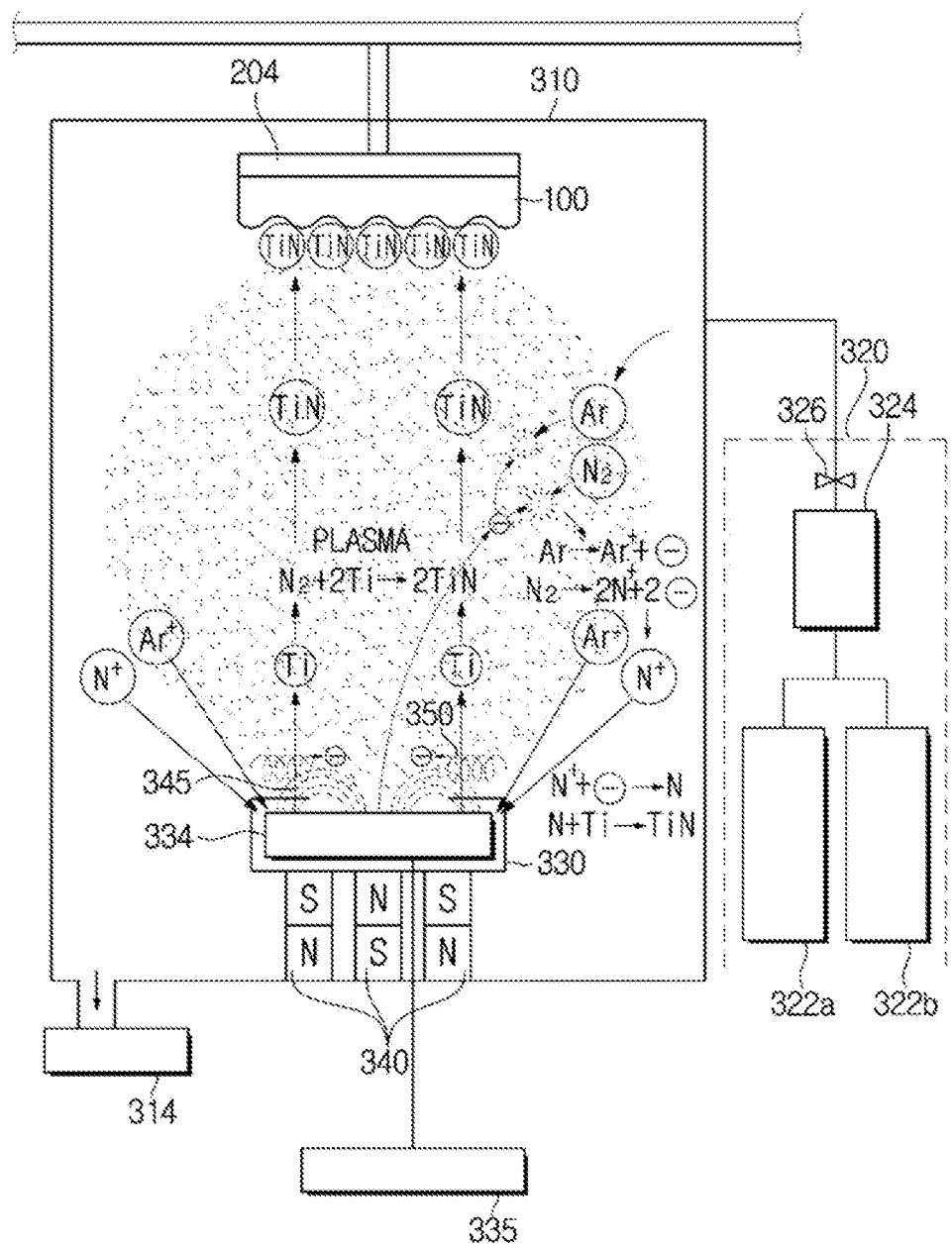

Particularly, in order to deposit the first layer 110 including titanium nitride (TiN) on the plastic object 100, the plastic object 100 may be mounted in an upper portion of the second vacuum chamber 310 and a titanium (Ti) target sample 334 may be placed on a lower portion of the second vacuum chamber 310 as illustrated in FIG. 2B.

Sequentially, while the second vacuum chamber 310 is maintained in a vacuum state by the vacuum pump 314, an argon (Ar) gas and a nitrogen (N$_2$) gas may be injected into the inside of the second vacuum chamber 310 by adjusting the mass flow meter 326. When the power is supplied to the gun 330 through the second power supply 335, discharging may be started, a reaction such as Reaction Formula 1 described above may occur, and thus plasma, in which the argon (Ar) gas and the nitrogen (N$_2$) gas are simultaneously ionized, may be formed.

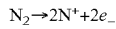  Reaction Formula 2

$$N_2 \rightarrow 2N^+ + 2e_-$$

In this case, not all of the nitrogen (N$_2$) gas is ionized. Some amount of the nitrogen (N$_2$) gas may be present in a molecular state and another amount of the nitrogen (N$_2$) gas may be in an ionized state.

Particularly, the ionized argon gas (Ar⁺) and the ionized nitrogen gas (N⁺) are attracted and accelerated toward a titanium (Ti) target sample 334 which acts as cathode by receiving a force of the electric field. The accelerated argon ion (Ar⁺) is collided with the titanium (Ti) target sample 334, transfers energy to a surface of the target sample 334, and then a titanium atom (Ti) of the target sample 334 is ejected. The titanium atom (Ti) having high energy reacts with the nitrogen (N$_2$) gas injected into the inside of the second vacuum chamber 310 as illustrated in Reaction Formula 3, and then the first layer 110 including a titanium nitride (TiN) component is formed.

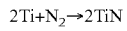  Reaction Formula 3

$$2Ti + N_2 \rightarrow 2TiN$$

Since the method of manufacturing the multilayer thin film according to an exemplary embodiment includes the deposition of the first layer 110, adjusting the method in order that the titanium (Ti) target sample 334 and the nitrogen (N$_2$) gas completely react may be implemented.

Meanwhile, some of the ionized nitrogen gas (N⁺), which is attracted and accelerated toward the titanium (Ti) target sample 334, may be collided with the surface of the titanium (Ti) target sample 334 as illustrated in Reaction Formula 4, may receive electrons and may be neutralized (Reaction Formula 4 (1)). Some thereof may react with titanium (Ti) (Reaction Formula 4 (2)) and then titanium nitride (TiN) may be also formed.

Reaction Formula 4

  (1)

$$N^+ + e_- \rightarrow N$$

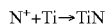  (2)

$$N^+ + Ti \rightarrow TiN$$

The second power supply 335 of the second vacuum chamber 310 illustrated in FIG. 2B may use a DC power source, a pulsed DC power source, or an RF power source. Since a density of the deposited layer is not high when using the DC power source, a deposition speed of the titanium nitride (TiN) may be slow when using the RF power source, and thus a deposition rate may be reduced. Accordingly, the pulsed DC power source may be used as the second power supply 335.

The pulsed DC power source may have a voltage in a range of 0 V to 600 V and the first layer 110 may be adjusted to have a thickness in a range of 1 nm to 500 nm so that various colors other than a color of metal may be implemented. A principle of color implementation of the first layer 110 will be described in detail in the following related section.

In addition, since the pulsed DC power source has a higher deposition rate in comparison with the RF power source and a lower deposition rate in comparison with the DC power source, at least one chamber in the same condition as the second vacuum chamber 310 may further be provided next to the second vacuum chamber 310 and then the deposition of titanium nitride (TiN) may be performed.

When the deposition of the first layer 110 is completed, the deposition of the second layer 120 on the first layer 110 may be performed.

Figure 2C:
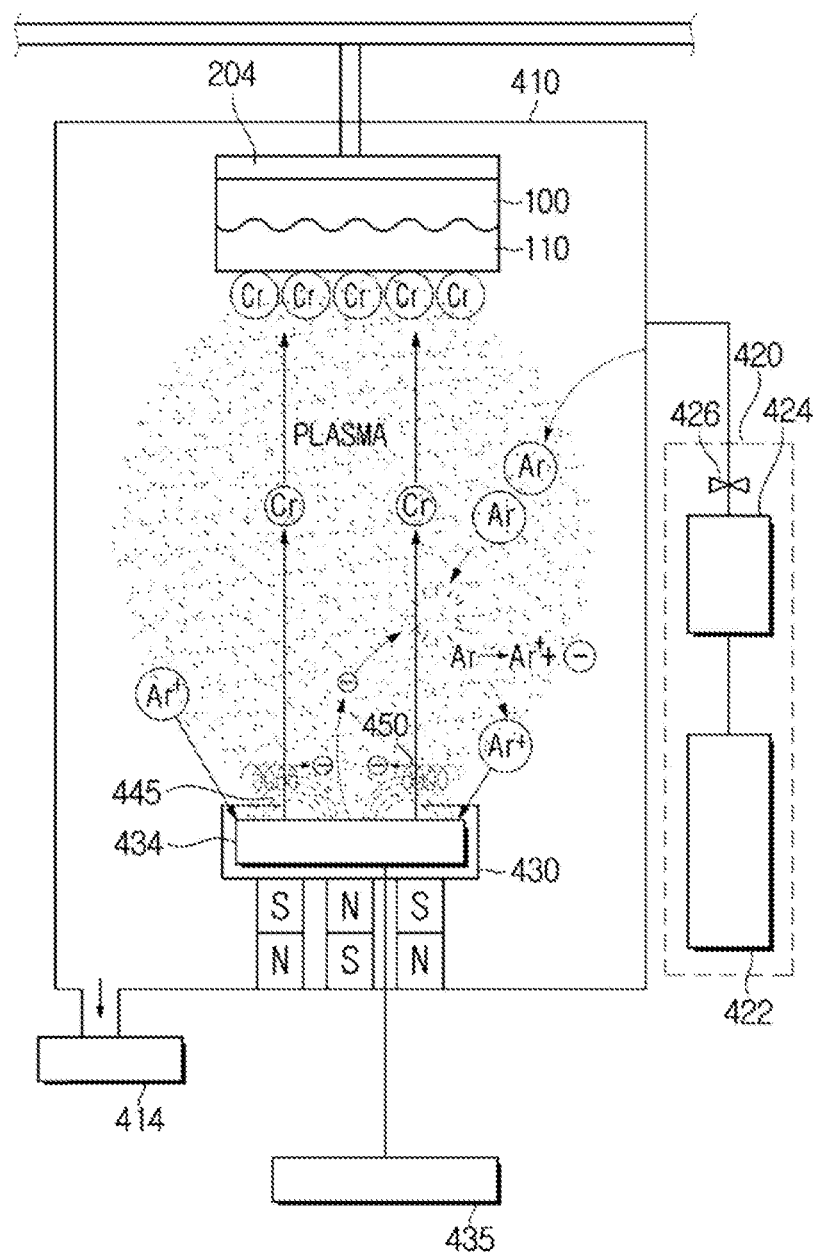

Particularly, in order to deposit the second layer 120 on the plastic object 100 on which the first layer 110 is deposited, the plastic object 100 in which plasma treatment is performed, may be mounted in an upper portion of the third vacuum chamber 410 and a chromium (Cr) target sample 434 may be placed on a lower portion of the third vacuum chamber 410 as illustrated in FIG. 2C. While the third vacuum chamber 410 is maintained in a vacuum state by the vacuum pump 414, an argon (Ar) gas may be injected into the inside of the third vacuum chamber 410 by adjusting the mass flow meter 426.

Sequentially, when the power is supplied to the gun 430 through the third power supply 435, discharging may be started, a reaction such as Reaction Formula 1 described above may occur, and thus plasma, in which the argon (Ar) gas is ionized, may be formed. When a positively charged argon ion (Ar⁺) is collided with the chromium (Cr) target sample 434, a chromium (Cr) atom may be ejected and then the second layer 120 may be formed.

The third power supply 435 may use a DC power source, a pulsed DC power source, or an RF power source. Since a density of the deposited layer is not high when using the DC power source, a deposition speed of the chromium (Cr) atom may be slow when using the RF power source, and thus the pulsed DC power source may be used as the third power supply 435.

The pulsed DC power source may have a voltage in a range of 0 V to 600 V and the second layer 120 may be adjusted to have a thickness in a range of 1 nm to 500 nm.

When the deposition of the second layer 120 is completed, the deposition of the third layer 130 on the second layer 120 may be performed.

Figure 2D:
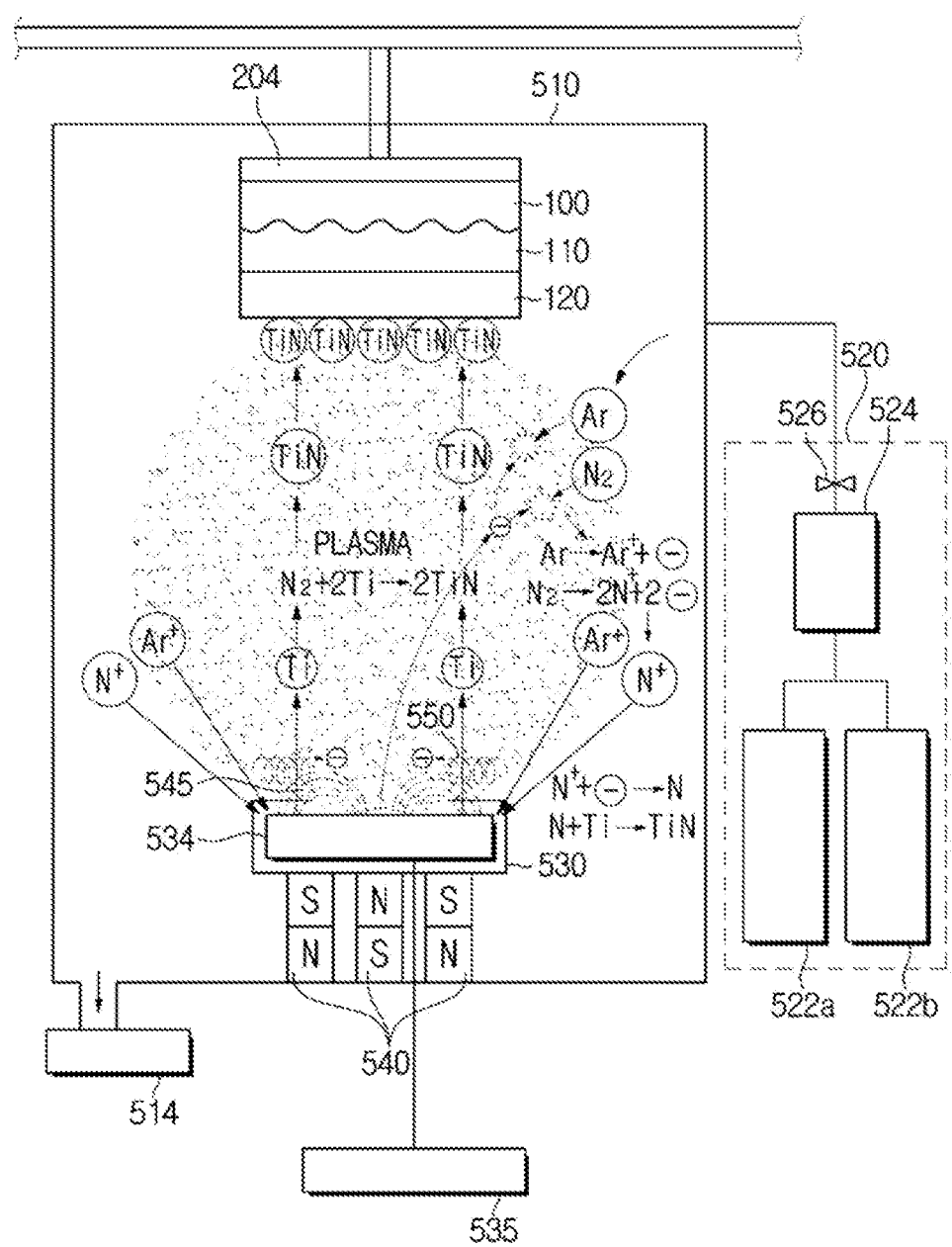

Particularly, in order to deposit the third layer 130 including titanium nitride (TiN) on the second layer 120, the plastic object 100, on which the second layer 120 is formed, may be mounted in an upper portion of the fourth vacuum chamber 510 and the titanium (Ti) target sample may be placed on a lower portion of the fourth vacuum chamber 510 as illustrated in FIG. 2D.

Sequentially, while the fourth vacuum chamber 510 is maintained in a vacuum state by the vacuum pump 514, the argon (Ar) gas and the nitrogen (N$_2$) gas may be injected into the inside of the fourth vacuum chamber 510 by adjusting the mass flow meter 526. Sequentially, when the power is supplied to the gun 530 through the fourth power supply 535, discharging may be started, a reaction such as Reaction Formulas 1 and 2 described above may occur, and thus plasma, in which the argon (Ar) gas and the nitrogen (N$_2$) gas are simultaneously ionized, may be formed.

In this case, not all of the nitrogen (N$_2$) gas is ionized. Some amount of the nitrogen (N$_2$) gas may be present in a molecular state and another amount of the nitrogen (N$_2$) gas may be in an ionized state.

Particularly, the ionized argon gas (Ar$^+$) and the ionized nitrogen gas (N$^+$) are attracted and accelerated toward a titanium (Ti) target sample 534 which acts as cathode by receiving a force of the electric field. The accelerated argon ion (Ar$^+$) is collided with the titanium (Ti) target sample 534, transfers energy to a surface of the target sample 534, and then a titanium atom (Ti) of the target sample 534 is ejected. The titanium atom (Ti) having high energy reacts with the nitrogen (N$_2$) gas injected into the inside of the fourth vacuum chamber 510 as illustrated in Reaction Formula 3, and then the third layer 130 including a titanium nitride (TiN) component is formed.

Since the method of manufacturing the multilayer thin film according to an exemplary embodiment includes the deposition of the third layer 130, adjusting the method in order that the titanium (Ti) target sample and the nitrogen (N$_2$) gas completely react may be implemented.

Some of the ionized nitrogen gas (N$^+$), which is attracted and accelerated toward the titanium (Ti) target sample 534, may be collided with the surface of the titanium (Ti) target sample 534 as illustrated in Reaction Formula 4, may receive electrons and may be neutralized (Reaction Formula 4 (1)). Some thereof may react with titanium (Ti) (Reaction Formula 4 (2)) and then titanium nitride (TiN) may be also formed.

The fourth power supply 535 of the fourth vacuum chamber 510 illustrated in FIG. 2D may use a DC power source, a pulsed DC power source, or an RF power source. Since a density of the deposited layer is not high when using the DC power source, a deposition speed of the titanium nitride (TiN) may be slow when using the RF power source, and thus a deposition rate may be reduced. Accordingly, the pulsed DC power source may be used as the fourth power supply 535.

The pulsed DC power source may have a voltage in a range of 0 V to 600 V and the third layer 130 may be adjusted to have a thickness in a range of 1 nm to 500 nm so that various colors as well as a color of a metal, may be implemented.

In addition, since the pulsed DC power source has a higher deposition rate in comparison with the RF power source and a lower deposition rate in comparison with the DC power source, at least one chamber in the same condition as the fourth vacuum chamber 510 may further be provided next to the fourth vacuum chamber 510 and then the deposition of titanium nitride (TiN) may be performed.

Hereinafter a method of manufacturing multilayer thin film according to an exemplary embodiment will be described in detail.

According to an exemplary embodiment, the method of manufacturing the multilayer thin film may be performed by using the multilayer thin film manufacturing device, and may include modifying a surface of the plastic object by a plasma treatment, depositing a first layer on the plastic object, and depositing a second layer on the first layer, and depositing a third layer on the second layer.

As described above, the plasma treatment and the multilayer thin film deposition may be performed by applying the sputtering method. The method of manufacturing the multilayer thin film is performed using a multilayer thin film manufacturing device different from a configuration of FIG. 1. Hereinafter, a configuration of the sputtering deposition device according to an exemplary embodiment will be described and then the method of manufacturing the multilayer thin film according to an exemplary embodiment will be described.

Figure 3:
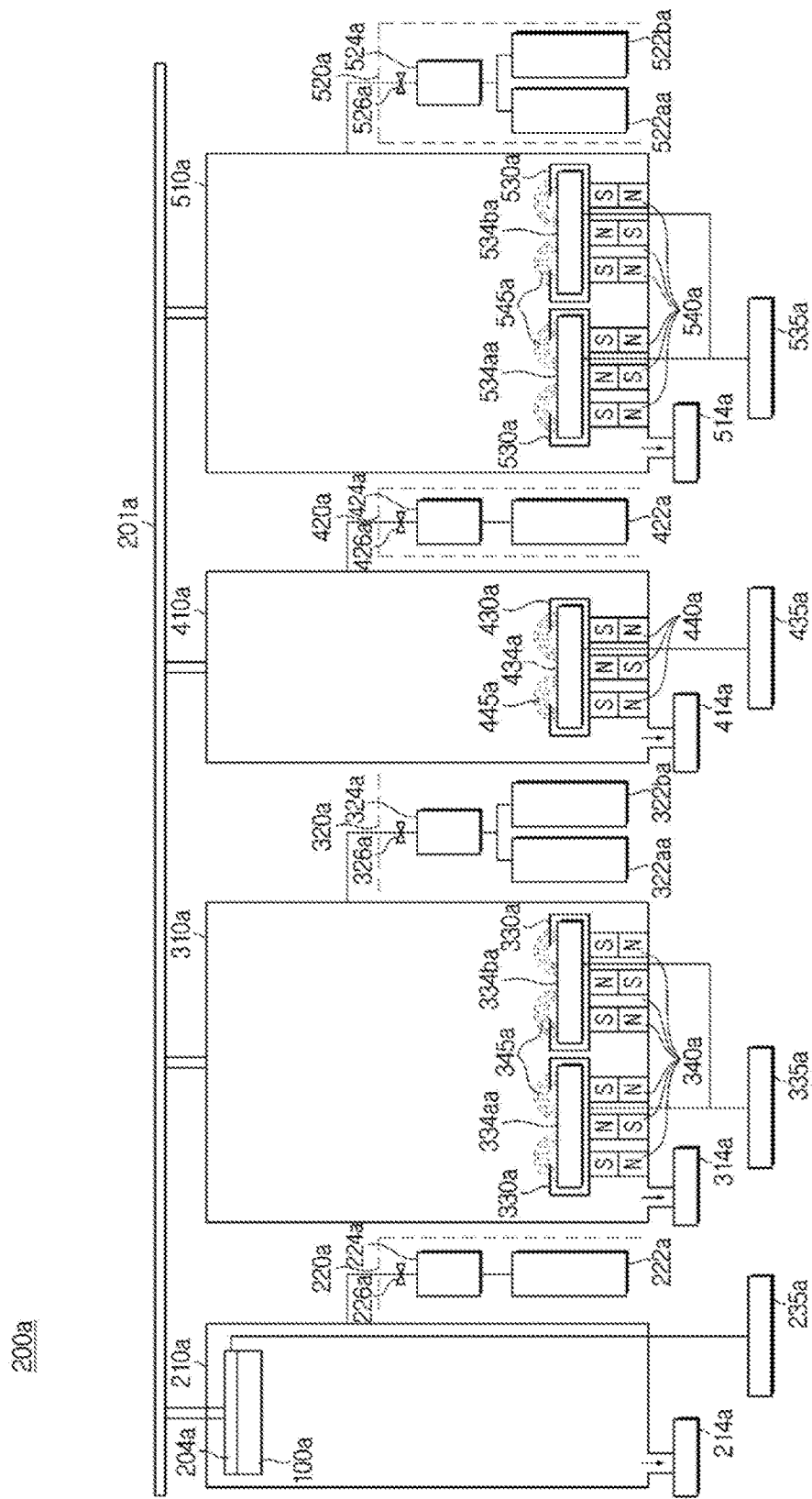
FIG. 3 is a view of an example of a sputtering deposition device configured to perform a method of manufacturing multilayer thin film according to an exemplary embodiment of the present disclosure.

FIG. 3 is a view of an example of a sputtering deposition device 200*a* configured to perform a method of manufacturing multilayer thin film according to an exemplary embodiment of the present disclosure.

Referring to FIG. 3, the sputtering deposition device 200*a* may include a plurality of vacuum chambers 210*a*, 310*a*, 410*a* and 510*a*, vacuum pumps 214*a*, 314*a*, 414*a* and 514*a*, gas supply systems 220*a*, 320*a*, 420*a* and 520*a*, a rail 201*a*, a jig 204*a*, target samples 334*a*, 434*a* and 534*a*, guns 330*a*, 430*a* and 530*a*, power supplies 235*a*, 335*a*, 435*a*, and 535*a*, and a plurality of magnetrons 340*a*, 440*a* and 540*a*. The vacuum chambers 210*a*, 310*a*, 410*a* and 510*a*, the vacuum pumps 214*a*, 314*a*, 414*a* and 514*a*, the guns 330*a*, 430*a* and 530*a*, and the plurality of magnetrons 340*a*, 440*a* and 540*a* are substantially the same as the configuration of FIG. 1 and a repeated description thereof will be omitted.

The gas supply systems 220*a*, 320*a*, 420*a* and 520*a* may be provided on sides of the vacuum chambers 210*a*, 310*a*, 410*a* and 510*a*, respectively, and may supply gas into the inside of the vacuum chambers 210*a*, 310*a*, 410*a* and 510*a*, respectively.

The gas supply systems 220*a*, 320*a*, 420*a* and 520*a* may include discharge gas chambers 222*a*, 322*aa*, 422*a* and 522*aa* in which an argon (Ar) gas to be ionized is stored, a process gas chamber 322*ba* and 522*ba* in which a nitrogen (N$_2$) gas or an oxygen (O$_2$) gas provided as a process gas for a plasma chemical deposition process are stored, mass flow meters 224*a*, 324*a*, 424*a* and 524*a* configured to connect the vacuum chambers 210*a*, 310*a*, 410*a* and 510*a* to the gas chambers 222*a*, 322*aa*, 322*ba*, 422*a*, 522*a*, and 522*ba*, and control valves 226*a*, 326*a*, 436*a* and 526*a* configured to control the gas flowing from the gas chambers 222*a*, 322*aa*, 322*ba*, 422*a*, 522*a*, and 522*ba* to the vacuum chambers 210*a*, 310*a*, 410*a* and 510*a*.

The rail 201*a* may be provided on an upper portion of the vacuum chambers 210*a*, 310*a*, 410*a* and 510*a*, and may move an object to be deposited. Particularly, the object to be deposited may be fixed to a jig 204*a* and moved along the rail 201*a*. The object to be deposited may be a planar plastic object, also a part including a plastic material, in which a curved surface or a protruding part is included in a part of a surface, and a part formed by a metal material. A plastic object 100*a* having a planar shape will be described as an example in FIGS. 3, and 4A to 4D.

The target sample 334*aa*, 334*ba*, 434*a*, 534*aa*, and 534*ba* may be provided inside the vacuum chambers 310*a*, 410*a* and 510*a* and positioned opposite to the object to be deposited. As described above, the object to be deposited may have a planar shape or a curved shape, and a plurality of target samples 334*aa*, 334*ba*, 434*a*, 534*aa*, and 534*ba* may be used depending on a shape of the object to be deposited. According to an exemplary embodiment, a plurality of target samples 334*aa* and 334*ba* may be placed inside the second vacuum chamber 310*a* to form a first layer 110*a*, and a plurality of target samples 534aa and 534ba may be placed inside the fourth vacuum chamber 510a to form a third layer 130a, respectively.

Magnetic fields 345a, 445a and 545a are formed by the magnetrons 340a, 440a and 540a, and thus electrons separated from the argon (Ar) gas move in a spiral path 350a, 450a, and 550a, by simultaneously receiving forces of the magnetic fields 345a, 445a and 545a formed by the magnetrons 340a, 440a and 540a and the existing electric field. Since the electrons that move in a spiral path are trapped in the magnetic fields 345a, 445a and 545a, it may be difficult for the electrons to escape, and a density of the electrons in the plasma may be increased. Because of this, ionized argon ($Ar^+$) may be increased in the vacuum chambers 310a, 410a and 510a, the number of the argon (Ar) ions colliding with the target samples 334aa, 334ba, 434a, 534aa, and 534ba may be also increased, and thus the efficiency of a thin film deposition may be improved.

Figure 4A:
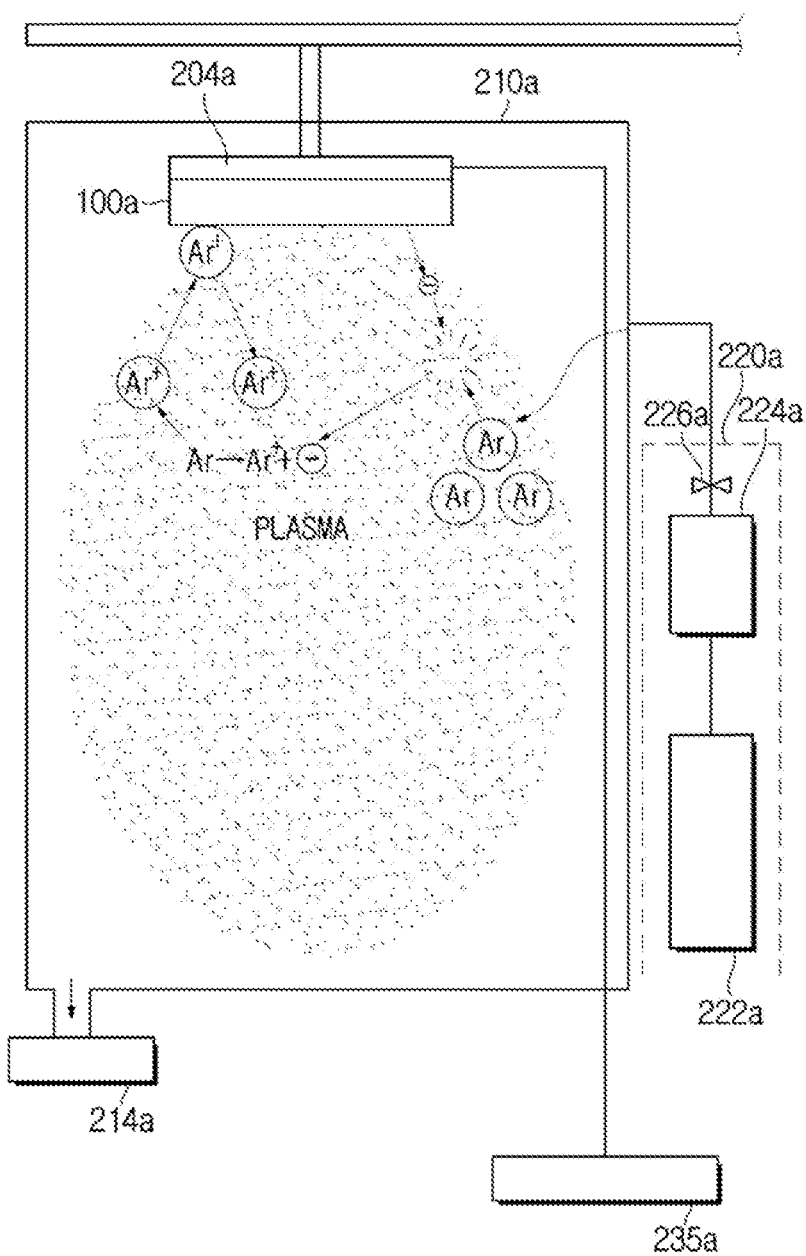
FIGS. 4A, 4B, 4C, and 4D are views of a process of performing the method of manufacturing multi-layer thin film by the device of FIG. 3.
Figure 4B:
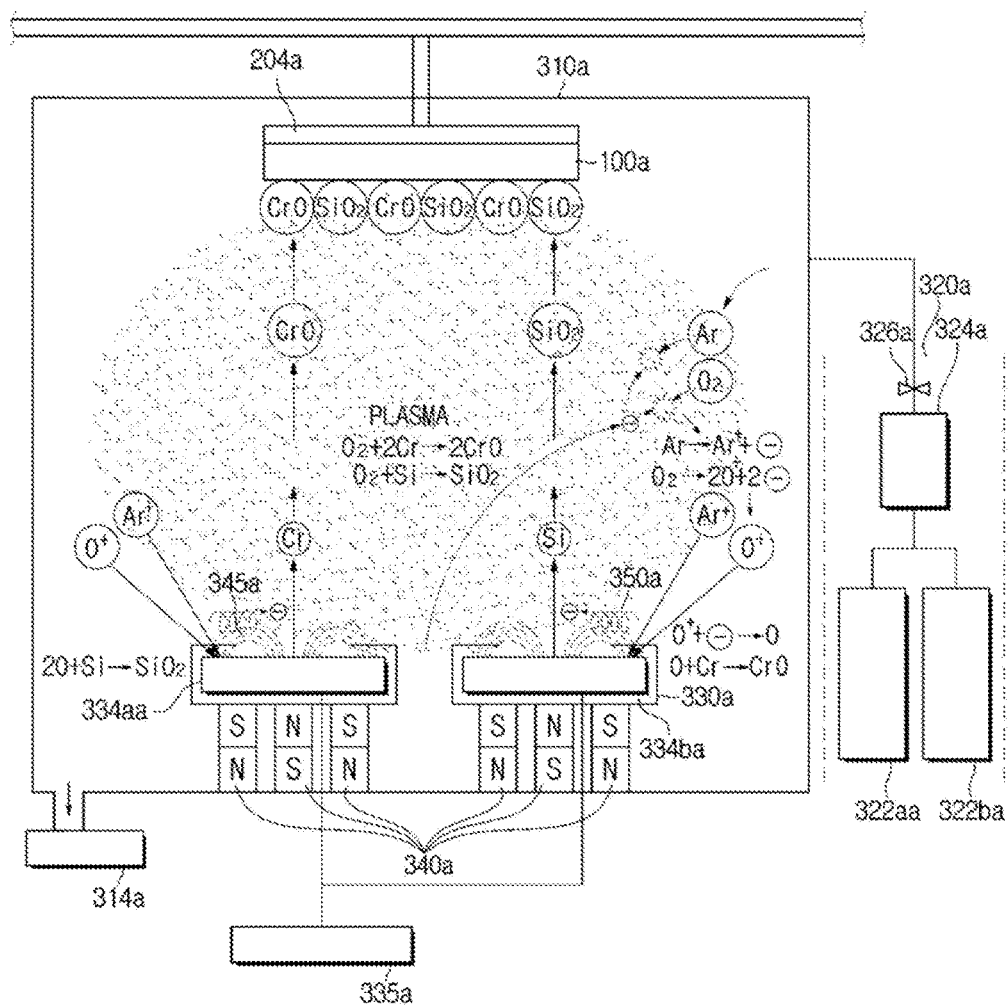
Figure 4C:
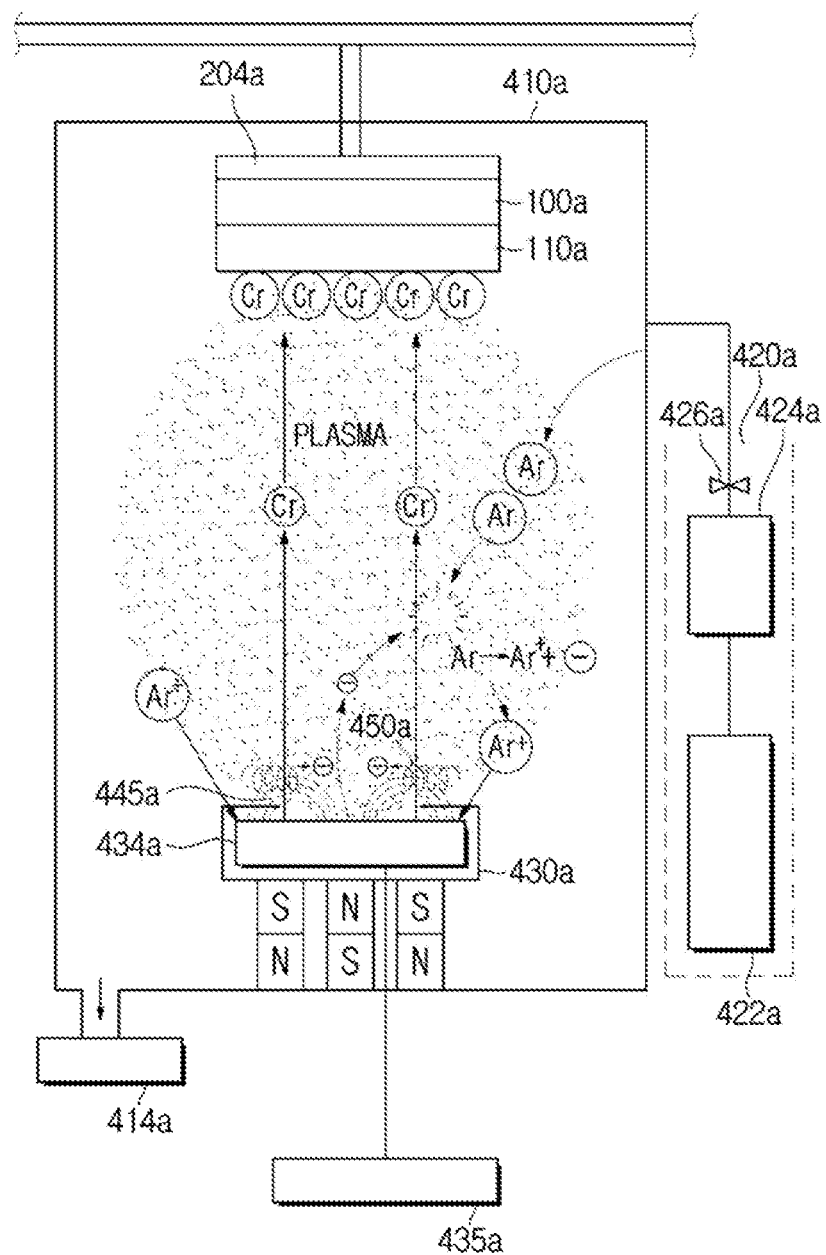
Figure 4D:
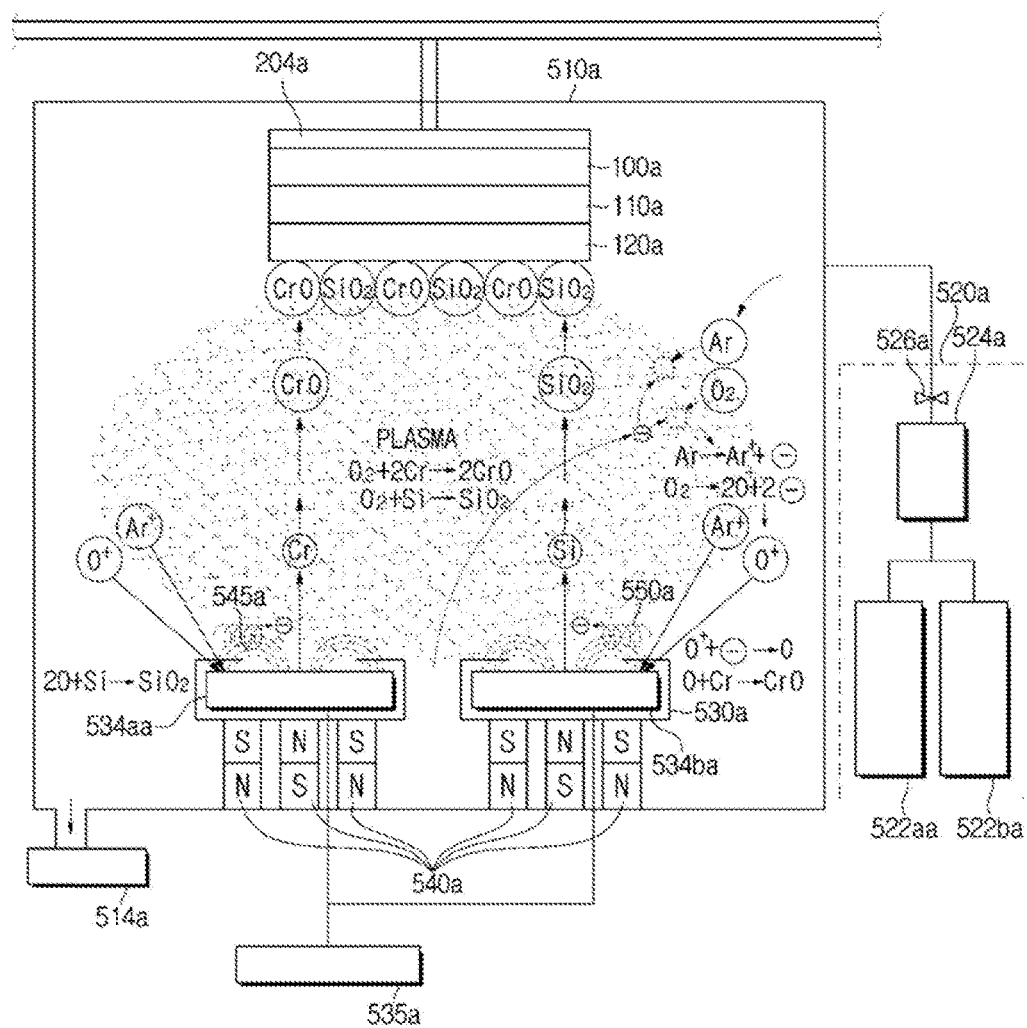

FIGS. 4A and 4D are views a process of performing the method of manufacturing multilayer thin film by the sputtering deposition device 200a of FIG. 3.

Referring to FIGS. 4A to 4D, the method of manufacturing the multilayer thin film according to an exemplary embodiment may include modifying a surface of the plastic object 100a, depositing the first layer 110a on the plastic object 100a, depositing the second layer 120a on the first layer 110a, and depositing the third layer 130a on the second layer 120a.

The deposition of the first layer 110a on the plastic object 100a may include providing a target sample 334aa including at least one selected from a group consisting of aluminum (Al), chromium (Cr), titanium (Ti), and Tin (Sn), providing a target sample 334ba including silicon (Si), injecting at least one reaction gas selected from a group consisting of nitrogen ($N_2$) and oxygen ($O_2$), applying power source to the sputtering deposition device 200a, and reacting the target sample 334aa and 334ba with the reaction gas.

In addition, the deposition of the second layer 120a on the first layer 110a may include providing a target sample 434a including a metallic material including at least one selected from a group consisting of aluminum (Al), chromium (Cr), titanium (Ti), and Tin (Sn), and applying the power source to the sputtering deposition device 200a.

The deposition of the third layer 130a on the second layer 120a may include providing a target sample 534aa including at least one component selected from a group consisting of aluminum (Al), chromium (Cr), titanium (Ti), and Tin (Sn), providing a target sample 534ba including silicon (Si), injecting at least one reaction gas selected from a group consisting of nitrogen ($N_2$) and oxygen ($O_2$), applying power source to the sputtering deposition device 200a, and reacting the target sample 534aa and 534ba with the reaction gas.

Hereinafter a method of manufacturing the multilayer thin film, which includes the first layer 110a including chromium oxide (CrO) and silicon dioxide ($SiO_2$), the second layer 120a including chromium (Cr), and the third layer 130a including chromium oxide (CrO) and silicon dioxide ($SiO_2$), on the plastic object 100a will be described in detail as an example.

First, as illustrated in FIG. 4A, the method includes moving the processed plastic object 100a to the first vacuum chamber 210a of the sputtering deposition device 200a, and modifying the surface of the plastic object 100a through plasma irradiation in an appropriate condition.

In this case, when power is supplied to the gun through a first power supply 235a and then a negative electric field is created, discharging may be started in the first vacuum chamber 210a and plasma may be generated. Description for a generation process of the plasma, discharge gas, and the power supply are the same as FIG. 2A, and a repeated descriptions will be omitted in the following.

When the modification of the surface is completed, the deposition of the multilayer thin film on the plastic object 100a may be performed through the sputtering method.

The method of manufacturing the multilayer thin film according to an exemplary embodiment may include depositing the first layer 110a, the second layer 120a, and the third layer 130a on the plastic object 100a. By using the method, a surface of a product on which a multilayer thin film is deposited may have be non-conductive.

Hereinafter, the deposition of the first layer 110a including chromium oxide (CrO) and silicon dioxide ($SiO_2$) on the plastic object 100a will be described in detail.

Prior to the deposition of the chromium oxide (CrO) and silicon dioxide ($SiO_2$), the plastic object 100a on which plasma treatment is performed, may be mounted in an upper portion of the second vacuum chamber 310a, and chromium (Cr) and silicon (Si) may be provided as the target sample 334aa and 334ba on a lower portion of the second vacuum chamber 310a as illustrated in FIG. 4B.

Sequentially, while the second vacuum chamber 310a is maintained in a vacuum state by the vacuum pump 314a, an argon (Ar) gas and an oxygen ($O_2$) gas may be injected into the second vacuum chamber 310a by adjusting the mass flow meter 326a.

The power is supplied to the gun 330a through the second power supply 335a, discharging may be started, reactions such as the above-described Reaction Formula 1 and the following Reaction Formula 5 may occur, and then plasma in which the argon (Ar) gas and the oxygen ($O_2$) gas are simultaneously ionized may be formed.

$$O_2 \rightarrow 2O^+ + 2e_-$$ <span style="float:right">Reaction Formula 5</span>

Not all of the oxygen ($O_2$) gas is ionized. Some amount of the oxygen ($O_2$) gas may be present in a molecular state and another amount of the oxygen ($O_2$) gas may be in an ionized state.

The ionized argon ion ($Ar^+$) and the ionized oxygen ion ($O^+$) are attracted and accelerated toward a chromium (Cr) target sample 334aa and a silicon (Si) target sample 334ba which act as a cathode by receiving a force of an electric field. The accelerated argon ion ($Ar^+$) is collided with the chromium (Cr) target sample 334aa and the silicon (Si) target sample 334ba, transfers energy to a surface of the chromium (Cr) target sample 334aa and the silicon (Si) target sample 334ba and then a chromium atom (Cr) and a silicon atom (Si) are ejected from the chromium (Cr) target sample 334aa and the silicon (Si) target sample 334ba due to the energy.

The chromium atom (Cr) and the silicon atom (Si) having high energy react with the oxygen ($O_2$) gas injected into the inside of the second vacuum chamber 310a as illustrated in the following Reaction Formula 6, and thus the first layer 110a including a chromium oxide (CrO) and a silicon dioxide ($SiO_2$) component is formed.

Reaction Formula 6

$$2Cr + O_2 \rightarrow 2CrO \tag{1}$$

$$Si + O_2 \rightarrow SiO_2 \tag{2}$$

Some amount of the oxygen ion ($O^+$), which is attracted and accelerated toward the chromium (Cr) target sample 334aa and the silicon (Si) target sample 334ba, may receive electrons and be neutralized (Reaction Formula 7 (1)) while colliding with the surface of the chromium (Cr) target sample 334aa and the silicon (Si) target sample 334ba as illustrated in Reaction Formula 7. Another amount of the oxygen ion (O⁺) may react with chromium (Cr) and the silicon (Si) (see Reaction Formula 7 (2), (3)) and then the chromium oxide (CrO) and the silicon dioxide ($SiO_2$) may be also formed.

Reaction Formula 7

$$O^+ + e_- \rightarrow O \quad (1)$$

$$O + Cr \rightarrow CrO \quad (2)$$

$$2O + Si \rightarrow SiO_2 \quad (3)$$

The second power supply 335a may use a DC power source, a pulsed DC power source, or an RF power source. Since a density of the deposited layer is not high when using the DC power source, a deposition speed of the chromium oxide (CrO) and the silicon dioxide ($SiO_2$) is slow when using the RF power source, and thus a deposition rate is reduced, the pulsed DC power source may be used as the second power supply 335a. In addition, it may be that power and deposition time of the pulsed DC power source may be adjusted so that the first layer 110a is formed to have a thickness in a range of 1 nm to 500 nm.

Next, the deposition of the second layer 120a including chromium (Cr) on the first layer 110a will be described in detail.

When the first layer 110a is formed, the plastic object 100a may be moved along the rail 201a and mounted in the third vacuum chamber 410a as illustrated in FIG. 4C in order to deposit the second layer 120a on the first layer 110a. When the plastic object 100a on which the first layer 110a is deposited is mounted in the third vacuum chamber 410a, the vacuum pump 414a may be adjusted so that the third vacuum chamber 410a may be maintained in a vacuum state and the mass flow meter 426a may be adjusted so that argon (Ar) gas may be injected into the inside of the third vacuum chamber 410a.

Plasma is generated in the same manner as the first vacuum chamber 210a, a positively charged argon ion (Ar⁺) is collided with the chromium (Cr) target sample 434a, a chromium (Cr) atom is ejected, and then the second layer 120a including a chromium (Cr) component is deposited on the first layer 110a.

The third power supply 435a may use a DC power source, a pulsed DC power source, or an RF power source. Since a density of the deposited layer is not high when using the DC power source, a deposition speed of the chromium atom (Cr) is slow when using the RF power source, and thus a deposition rate is reduced, the pulsed DC power source may be used as the third power supply 435a. In addition, it may be that power and deposition time of the pulsed DC power source may be adjusted so that the second layer 120a is formed to have a thickness in a range of 1 nm to 500 nm.

Next, the deposition of the third layer 130a including chromium (Cr) and the silicon dioxide ($SiO_2$) on the second layer 120a will be described in detail.

When the second layer 120a is formed, the plastic object 100a may be moved along the rail 201a and mounted in the fourth vacuum chamber 510a as illustrated in FIG. 4D in order to deposit the third layer 130a on the second layer 120a. When the plastic object 100a, on which the first layer 110a and the second layer 120a are deposited in sequence, is mounted in the fourth vacuum chamber 510a, the vacuum pump 514a may be adjusted so that the fourth vacuum chamber 510a may be maintained in a vacuum state and the mass flow meter 526a may be adjusted so that the argon (Ar) gas and the oxygen ($O_2$) gas may be injected into the inside of the fourth vacuum chamber 510a.

The fourth vacuum chamber 510a may have the same configuration as that of the second vacuum chamber 310a. Because of this, the third layer 130a may be provided as the same component as that of the first layer 110a. In addition, the deposition of the first layer 110a in the second vacuum chamber 310a may be performed through the same manner as that of the fourth vacuum chamber 510a, and thus the deposition of the third layer 130a on the second layer 120a may be performed. Therefore, a repeated description will be omitted.

The fourth power supply 535a may use a DC power source, a pulsed DC power source, or an RF power source. Since a density of the deposited layer is not high when using the DC power source, a deposition speed of the chromium atom (Cr) is slow when using the RF power source, and thus a deposition rate is reduced, the pulsed DC power source may be used as the fourth power supply 535a. In addition, it may be that power and deposition time of the pulsed DC power source may be adjusted so that the third layer 130a is formed to have a thickness in a range of 1 nm to 500 nm.

Next, a method of manufacturing multilayer thin film according to an exemplary embodiment will be described in detail.

According to an exemplary embodiment, the method of manufacturing the multilayer thin film may be performed by using the multilayer thin film manufacturing device, and may include modifying a surface of the plastic object by a plasma treatment, depositing a first layer on the plastic object, depositing a second layer on the first layer, and depositing a third layer on the second layer.

As described above, the plasma treatment and the multilayer thin film deposition may be performed by applying the sputtering method. The method of manufacturing the multilayer thin film is performed using a multilayer thin film manufacturing device, similar to a configuration of FIG. 1. According to an exemplary embodiment, the multilayer thin film manufacturing device may have another target sample and a gas supply system different from those in the multilayer thin film manufacturing device of FIG. 1, and the rest of the components may be the same as the multilayer thin film manufacturing device of FIG. 1.

Hereinafter, a configuration of the sputtering deposition device according to an exemplary embodiment will be described and then the method of manufacturing the multilayer thin film according to an exemplary embodiment will be described.

Figure 5:
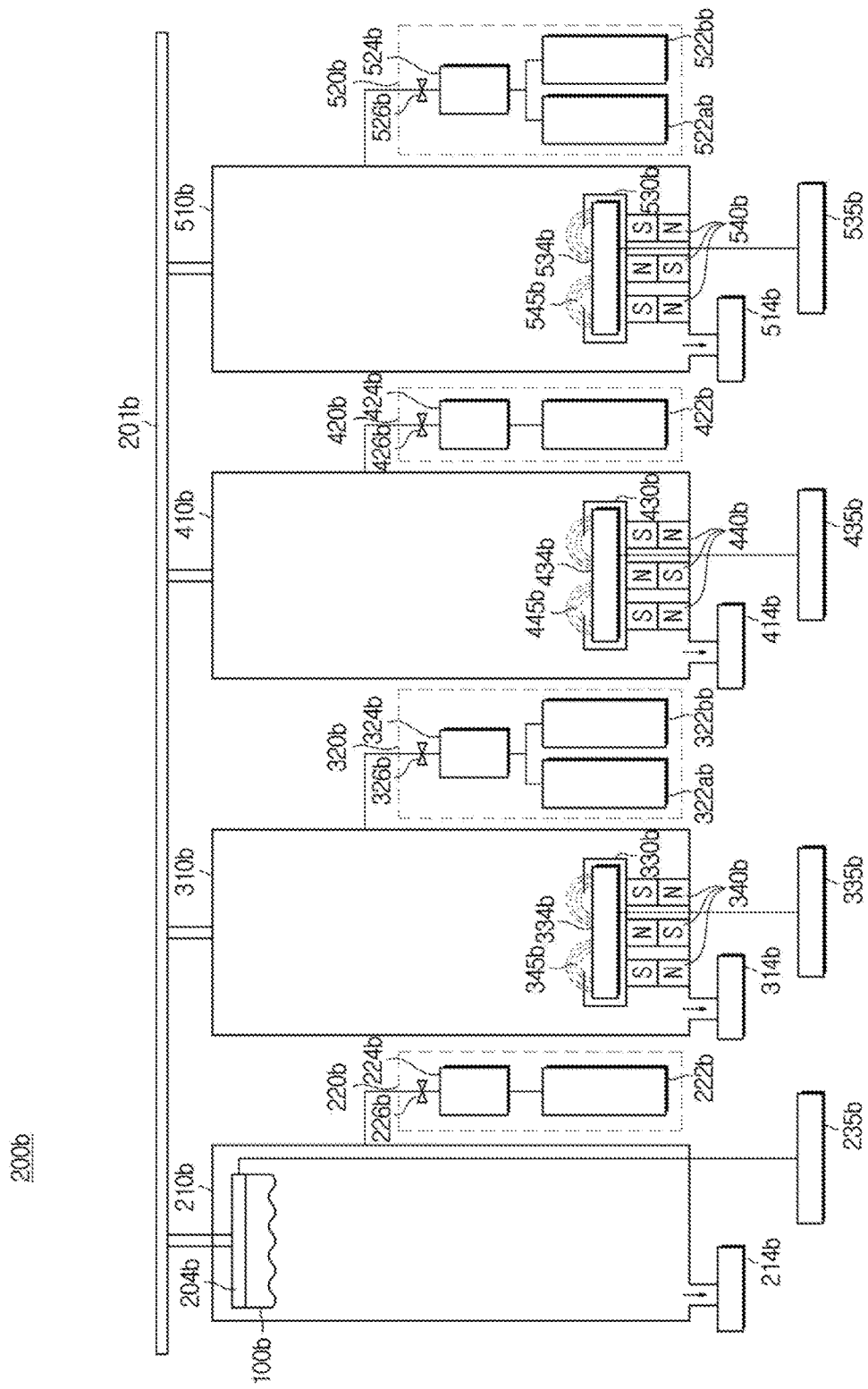
FIG. 5 is an exemplary view of a sputtering deposition device configured to perform a method of manufacturing multi-layer thin film according to an exemplary embodiment of the present disclosure.

FIG. 5 is an exemplary view of a sputtering deposition device 200b configured to perform a method of manufacturing multilayer thin film according to an exemplary embodiment of the present disclosure.

Referring to FIG. 5, the sputtering deposition device 200b may include a plurality of vacuum chambers 210b, 310b, 410b, and 510b, vacuum pumps 214b, 314b, 414b, and 514b, a plurality of gas supply systems 220b, 320b, 420b, and 520b, a rail 201b, a jig 204b, target samples 334b, 434b and 534b, guns 330b, 430b and 530b, and a plurality of magnetrons 340b, 440b and 540b. The plurality of vacuum chambers 210b, 310b, 410b, and 510b, the vacuum pumps 214b, 314b, 414b, and 514b, the guns 330b, 430b and 530b, and the plurality of magnetrons 340b, 440b and 540b may be the same as the configuration of FIG. 1, and thus a repeated description will be omitted.

The gas supply systems 220b, 320b, 420b, and 520b may be provided on side walls of the vacuum chambers 210b, 310b, 410b, and 510b, respectively, and may supply gas into the vacuum chambers 210b, 310b, 410b, and 510b.

The gas supply systems 220b, 320b, 420b, and 520b may include discharge gas chambers 222b, 322ab, 422b, and 522ab in which a discharge gas to be ionized is stored, a process gas chamber 322bb and 522bb in which a nitrogen ($N_2$) gas or an oxygen ($O_2$) gas provided as a process gas for a plasma chemical deposition is stored, mass flow meters 224b, 324b, 424b and 524b configured to connect the vacuum chambers 210b, 310b, 410b and 510b to the gas chambers 222b, 322ab, 322bb, 422b, 522a and 522bb, and control valves 226b, 326b, 426b and 526b configured to control gas flowing from the gas chambers 222b, 322ab, 322bb, 422b, 522ab and 522bb to the vacuum chambers 210b, 310b, 410b and 510b.

The rail 201b may be provided at an upper portion of the vacuum chambers 210b, 310b, 410b and 510b, and may move an object to be deposited. Particularly, the object to be deposited may be fixed to a jig 204b and moved along the rail 201b. The object to be deposited may be a planar plastic object, also a part including a plastic material, in which a curved surface or a protruding part is included in a part of a surface, and a part formed by a metal material. A plastic object 100b having a planar shape will be described as an example in FIGS. 5, and 6A to 6D.

The target sample 334b, 434b, and 534b may be provided inside the vacuum chambers 310b, 410b and 510b and may be positioned opposite to the object to be deposited. As described above, the object to be deposited may have a planar shape or a curved shape, and a plurality of target samples 334b, 434b, and 534b may be provided on a different position depending on a shape of the object to be deposited.

Magnetic fields 345b, 445b and 545b are formed by the magnetrons 340b, 440b and 540b, and thus electrons separated from the argon (Ar) gas move in a spiral path 350b, 450b, and 550b, by simultaneously receiving forces of the magnetic fields 345b, 445b and 545b formed by the magnetrons 340b, 440b and 540b and the existing electric field. Since the electrons that move in a spiral path are trapped in the magnetic fields 345b, 445b and 545b, it may be difficult for the electrons to escape, and a density of the electrons in the plasma may be increased. Because of this, ionized argon ($Ar^+$) may be increased in the vacuum chambers 310b, 410b and 510b, the number of the argon (Ar) ions colliding with the target samples 334b, 434b and 534b may be also increased, and thus the efficiency of a thin film deposition may be improved.

Figure 6A:
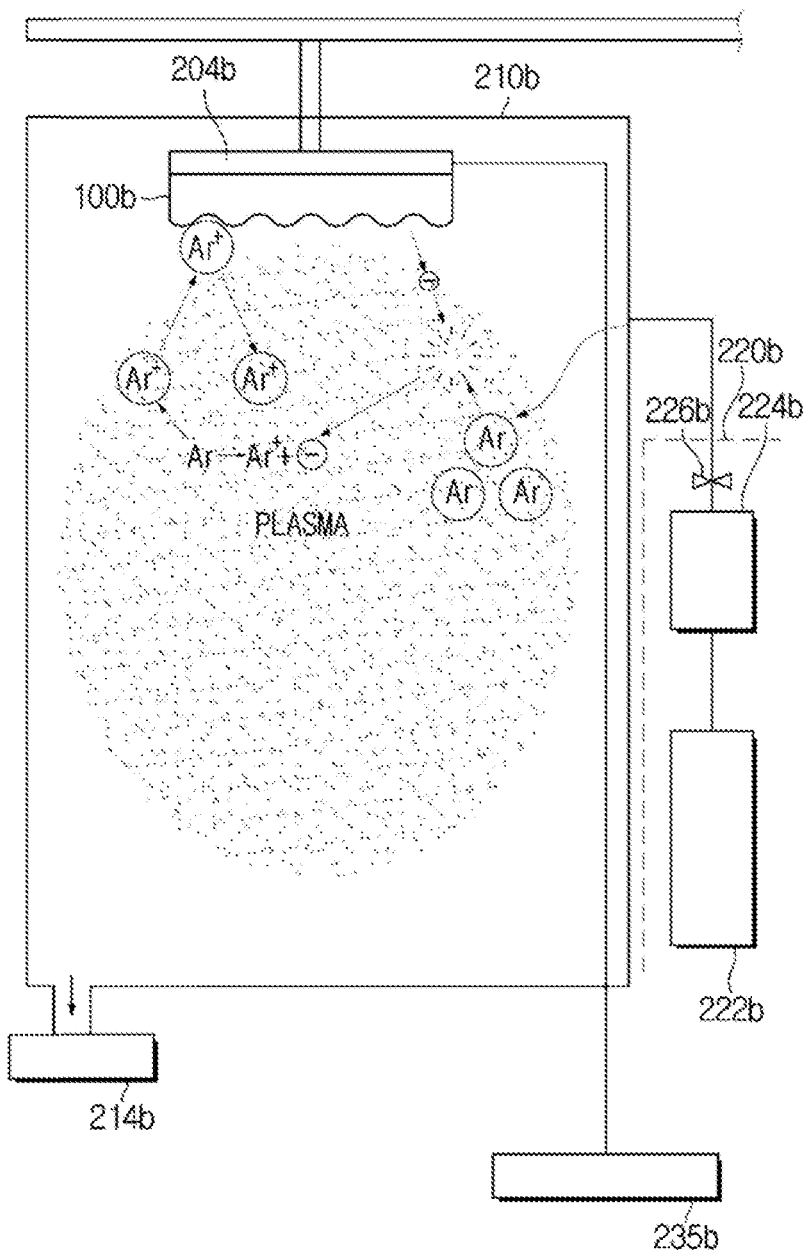
FIGS. 6A, 6B, 6C, and 6D are views of a process of performing the method of manufacturing multi-layer thin film by the device of FIG. 5.
Figure 6B:
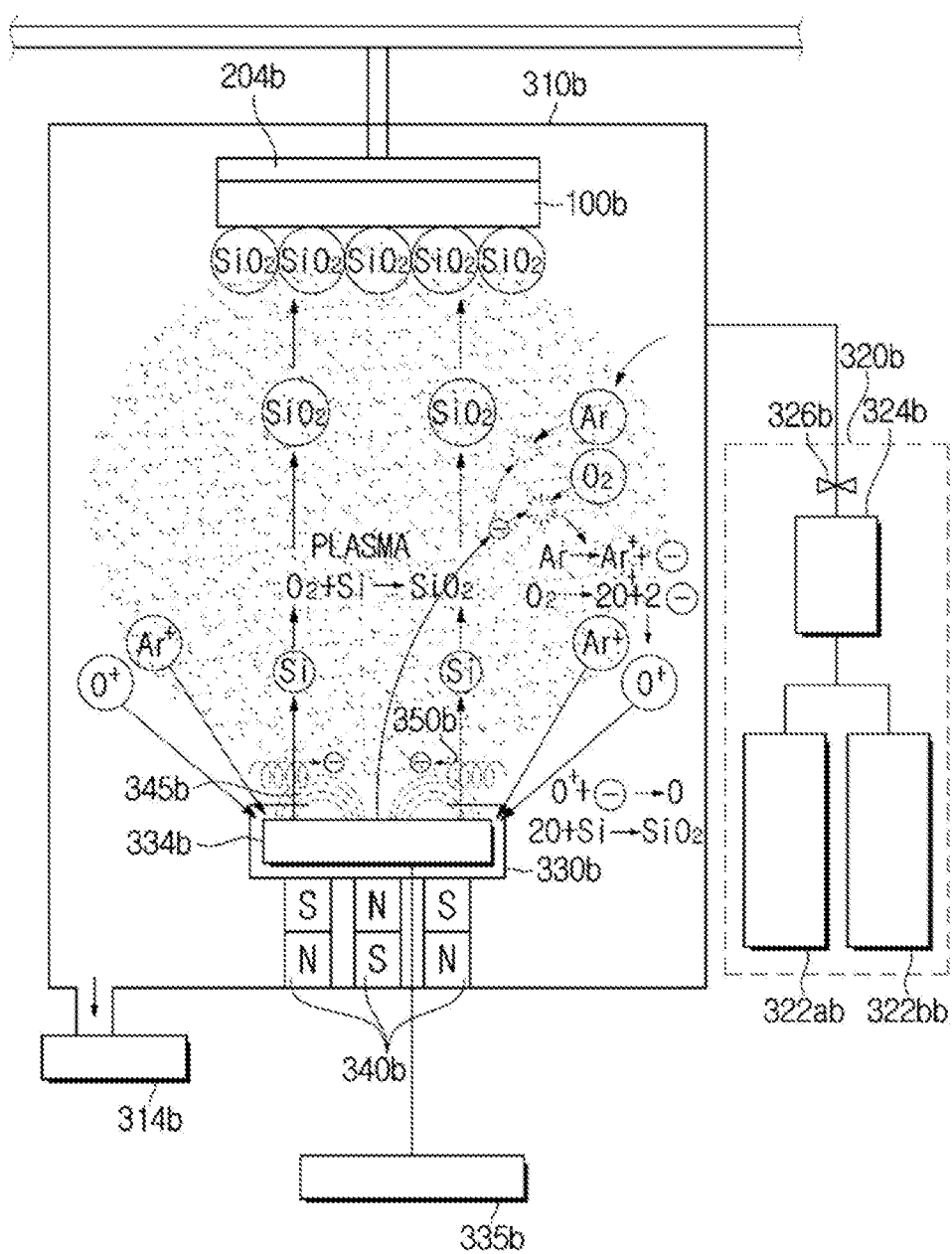
Figure 6C:
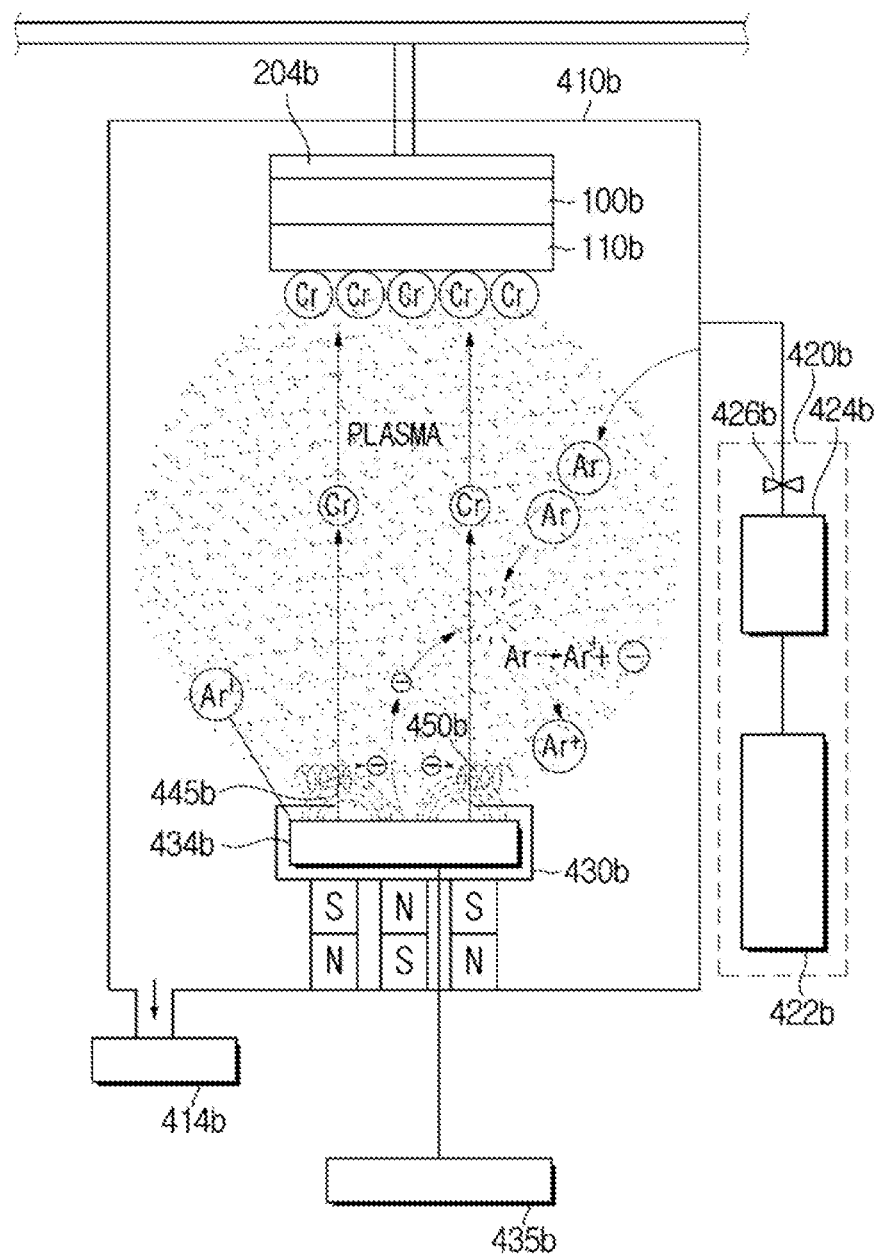
Figure 6D:
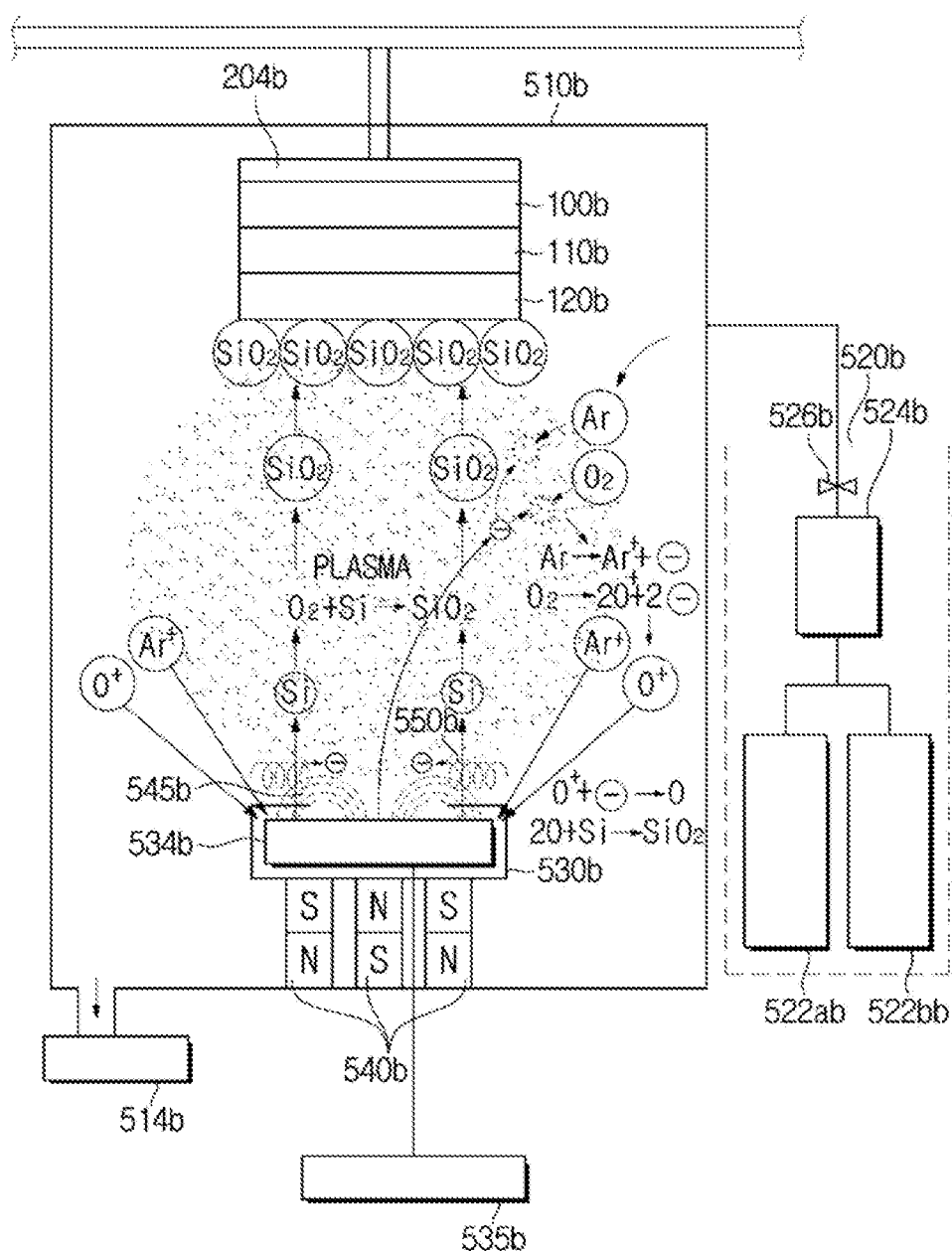

FIGS. 6A and 6D are views a process of performing the method of manufacturing multilayer thin film by the sputtering deposition device 200b of FIG. 5.

Referring to FIGS. 6A to 6D, the method of manufacturing the multilayer thin film according to an exemplary embodiment may include modifying a surface of the plastic object 100b by a plasma treatment, depositing a first layer 110b on the plastic object 100b, and depositing a second layer 120b on the first layer 110b, and depositing a third layer 130b on the second layer 120b.

The deposition of the first layer 110b on the plastic object 100b may include providing a silicon (Si) as a target sample 334b, injecting a reaction gas including at least one selected from a group consisting of nitrogen ($N_2$) and oxygen ($O_2$), applying a power source to the sputtering deposition device 200b, and reacting the target sample 334b with the reaction gas.

The deposition of the second layer 120b on the first layer 110b may include providing a metallic material including at least one selected from a material group consisting of aluminum (Al), chromium (Cr), titanium (Ti), and tin (Sn) as a target sample 434b, and applying a power source to the sputtering deposition device 200b.

The deposition of the third layer 130b on the second layer 120b may include providing a silicon (Si) as a target sample 534b, injecting a reaction gas including at least one selected from a group consisting of nitrogen ($N_2$) and oxygen ($O_2$), applying a power source to the sputtering deposition device 200b, and reacting the target sample 534b with the reaction gas.

Hereinafter a process of manufacturing the multilayer thin film which includes the first layer 110b including silicon dioxide ($SiO_2$) on the plastic object 100b, the second layer 120b including chromium (Cr) and the third layer 130b including silicon dioxide ($SiO_2$) will be described in detail as an example.

First, as illustrated in FIG. 6A, the method includes moving the processed plastic object 100b to the first vacuum chamber 210b of the sputtering deposition device 200b, and modifying the surface of the plastic object 100b through plasma irradiation in an appropriate condition.

In this case, when power is supplied to the gun through a first power supply 235b and then a negative electric field is created, discharging may be started in the first vacuum chamber 210b and plasma may be generated. Description for a generation process of the plasma, discharge gas, and the power supply are the same as FIG. 2A, and a repeated descriptions will be omitted.

When the modification of the surface is completed, the deposition of multilayer thin film on the plastic object 100b may be performed through the sputtering method.

The method of manufacturing the multilayer thin film according to an exemplary embodiment may include depositing the first layer 110b, the second layer 120b, and the third layer 130b on the plastic object 100b. By using the method, a surface of a product on which a multilayer thin film is deposited may be non-conductive.

Hereinafter, the deposition of the first layer 110b including silicon dioxide (SiO2) on the plastic object 100b will be described in detail.

Prior to the deposition of the silicon dioxide ($SiO_2$), the plastic object 100b, in which plasma treatment is performed, may be mounted in an upper portion of the second vacuum chamber 310b, and silicon (Si) may be provided as the target sample 334b on a lower portion of the second vacuum chamber 310b as illustrated in FIG. 6B.

Sequentially, while the second vacuum chamber 310b is maintained in a vacuum state by the vacuum pump 314b, an argon (Ar) gas and an oxygen ($O_2$) gas may be injected into the inside of the second vacuum chamber 310b by adjusting the mass flow meter 326b.

The power is supplied to the gun 330b through the second power supply 335b, discharging may be started, reactions such as the above-described Reaction Formula 1 and 5 may occur, and then plasma in which the argon (Ar) gas and the oxygen ($O_2$) gas are simultaneously ionized may be formed.

In this case, not all of the oxygen ($O_2$) gas is ionized. Some amount of the oxygen ($O_2$) gas may be present in a molecular state and another amount of the oxygen ($O_2$) gas may be in an ionized state.

Particularly, the ionized argon ion (Ar+) and the ionized oxygen ion (O+) are attracted and accelerated toward a silicon (Si) target sample 334b which acts as cathode by receiving a force of the electric field. The accelerated argon ion (Ar+) is collided with the silicon (Si) target sample 334b, transfers energy to a surface of the target sample 334b, and then a silicon atom (Si) is ejected from the target sample 334b.

The silicon atom (Si) having high energy may react with the oxygen ($O_2$) gas injected into the inside of the second vacuum chamber 310b as illustrated in Reaction Formula 6(2), and then the first layer 110b including the silicon dioxide ($SiO_2$) may be formed.

Some of the oxygen ion (O+), which is attracted and accelerated toward the silicon (Si) target sample 334b, may be collided with the surface of the silicon (Si) target sample 334b as illustrated in Reaction Formula 7, may receive electrons and may be neutralized (Reaction Formula 7 (1)). Some thereof may react with silicon (Si) (Reaction Formula 7 (3)) and then the silicon dioxide ($SiO_2$) may be also formed.

The second power supply 335b may use a DC power source, a pulsed DC power source, or an RF power source. Since a density of the deposited layer is not high when using the DC power source, a deposition speed of the silicon dioxide ($SiO_2$) is slow when using the RF power source, and thus a deposition rate is reduced, the pulsed DC power source may be used as the second power supply 335b. In addition, it may be that power and deposition time of the pulsed DC power source may be adjusted so that the first layer 110b is formed to have a thickness in a range of 1 nm to 500 nm.

Next, the deposition of the second layer 120b including chromium (Cr) on the first layer 110b will be described in detail.

When the first layer 110b is formed, the plastic object 100b may be moved along the rail 201b and mounted in the third vacuum chamber 410b as illustrated in FIG. 6C in order to deposit the second layer 120b on the first layer 110b. When the plastic object 100b on which the first layer 110b is deposited is mounted in the third vacuum chamber 410b, the vacuum pump 414b may be adjusted so that the third vacuum chamber 410b may be maintained in a vacuum state and the mass flow meter 426b may be adjusted so that argon (Ar) gas may be injected into the inside of the third vacuum chamber 410b.

Sequentially, plasma is generated in the same manner as the first vacuum chamber 210b, a positively charged argon ion (Ar+) is collided with the chromium (Cr) target sample 434b, a chromium (Cr) atom is ejected, and then the second layer 120b including a chromium (Cr) component is deposited on the first layer 110b.

The third power supply 435b may use a DC power source, a pulsed DC power source, or an RF power source. Since a density of the deposited layer is not high when using the DC power source, a deposition speed of the chromium atom (Cr) is slow when using the RF power source, and thus a deposition rate is reduced, the pulsed DC power source may be used as the second power supply 435b. In addition, it may be that power and deposition time of the pulsed DC power source may be adjusted so that the second layer 120b is formed to have a thickness in a range of 1 nm to 500 nm.

Next, the deposition of the third layer 130b including the silicon dioxide ($SiO_2$) on the second layer 120b will be described in detail.

When the second layer 120b is formed, the plastic object 100b may be moved along the rail 201b and mounted in the fourth vacuum chamber 510b as illustrated in FIG. 6D in order to deposit the third layer 130b on the second layer 120b. When the plastic object 100b, on which the first layer 110b and the second layer 120b are deposited in sequence, is mounted in the fourth vacuum chamber 510b, the vacuum pump 514b may be adjusted so that the fourth vacuum chamber 510b may be maintained in a vacuum state and the mass flow meter 526b may be adjusted so that the argon (Ar) gas and the oxygen ($O_2$) gas may be injected into the inside of the fourth vacuum chamber 510b.

The fourth vacuum chamber 510b may have the same configuration as that of the second vacuum chamber 310b. Because of this, the third layer 130b may be provided as the same component as that of the first layer 110b. In addition, the deposition of the first layer 110b in the second vacuum chamber 310b may be performed in the same manner as that of the fourth vacuum chamber 510b, and thus the deposition of the third layer 130b on the second layer 120b may be performed. Therefore, a repeated description will be omitted.

The fourth power supply 535b may use a DC power source, a pulsed DC power source, or an RF power source. Since a density of the deposited layer is not high when using the DC power source, a deposition speed of the chromium atom (Cr) is slow when using the RF power source, and thus a deposition rate is reduced, the pulsed DC power source may be used as the fourth power supply 535b. In addition, it may be that power and deposition time of the pulsed DC power source may be adjusted so that the third layer 130b is formed to have a thickness in a range of 1 nm to 500 nm.

Next, a plastic member in which a multilayer thin film is formed on a surface of a plastic object will be described.

First, a plastic member manufactured by the multilayer thin film manufacturing device 200 of FIG. 1 will be described with reference to FIG. 7.

Figure 7:
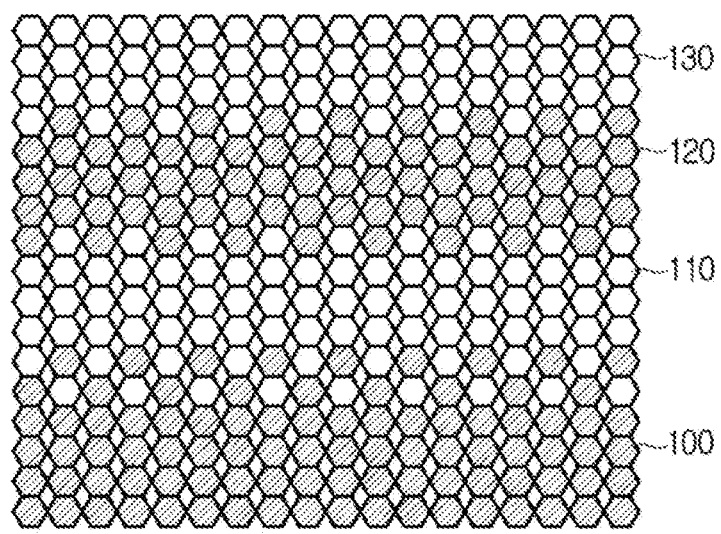
FIG. 7 is a view illustrating a structure of multilayer thin film deposited by the device of FIG. 1.

FIG. 7 is a view illustrating a structure of a plastic member according to an exemplary embodiment of the present disclosure. As illustrated in FIG. 7, the plastic member may include a first layer 110 deposited on a plastic object 100, a second layer 120 deposited on the first layer 110, and a third layer 130 deposited on the second layer 120.

The plastic object 100 may be smoother without a foreign substance due to a plasma treatment, and provided in a planar shape or in a curved shape.

The first layer 110 may include at least one selected from a group consisting of aluminum nitride (AlN), chromium nitride (CrN), titanium nitride (TiN), aluminum oxide ($Al_2O_3$), chromium oxide ($Cr_2O_3$), and titanium oxide ($Ti_2O_3$). The first layer 110 may be provided to implement various colors in addition to a color of metal, and interference patterns caused by reflection of light may be adjusted by adjusting wavelength of a thin film thickness, thereby implementing various colors.

The second layer 120 may include at least one selected from a group consisting of gold (Au), silver (Ag), aluminum (Al), chromium (Cr), titanium (Ti), and Tin (Sn). The second layer 120 may be provided to implement metal features, and elements thereof are not limited by the above-described examples. Therefore, the second layer 120 may include a material having high reflectivity within the scope, which is easy to be facilitated by those of skilled in the art.

The third layer 130 may include at least one selected from a group consisting of aluminum nitride (AlN), chromium nitride (CrN), titanium nitride (TiN), aluminum oxide ($Al_2O_3$), chromium oxide ($Cr_2O_3$), and titanium oxide ($Ti_2O_3$). The third layer 130 may be provided to include the same component as the first layer 110. The third layer 130 may be provided to implement various colors in addition to a color of metal, and interference patterns caused by reflection of light may be adjusted by adjusting wavelength of a thin film thickness, thereby implementing various colors.

The plastic member may be formed in a way that the first layer 110 and the third layer 130, in which plasma treatment is performed to allow a metal to be coupled to nitrogen ($N_2$) and oxygen ($O_2$), are formed at opposite sides of the second layer 120 having metal features, and thus the plastic member may have non-conductive. Because of this, the plastic member may have non-conductive surface so that the wireless communication quality and sensing quality in a plastic member, and an electronic product including a wireless communication device or a sensor may be improved.

Next, a plastic member manufactured by the multilayer thin film manufacturing device 200a of FIG. 3 will be described with reference to FIG. 8.

Figure 8:
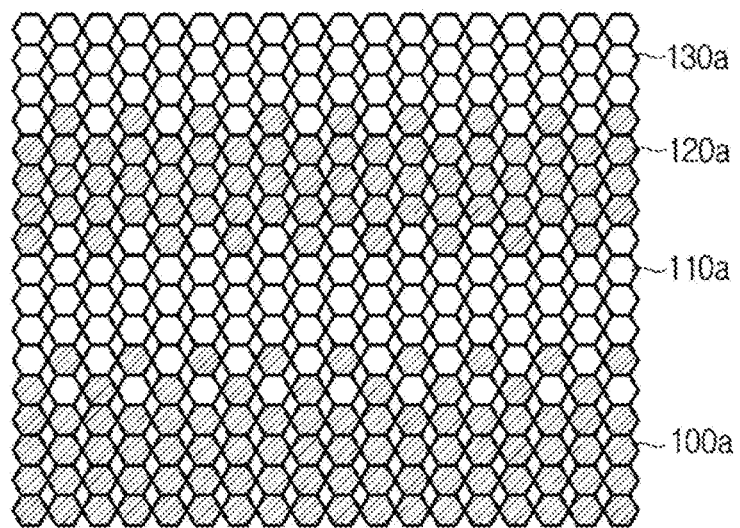
FIG. 8 is a view illustrating a structure of multilayer thin film deposited by the device of FIG. 3.

FIG. 8 is a view illustrating a structure of a plastic member according to an exemplary embodiment of the present disclosure. As illustrated in FIG. 8, the plastic member may include a first layer 110a deposited on a plastic object 100a, a second layer 120a deposited on the first layer 110a, and a third layer 130a deposited on the second layer 120a. The first layer 110a component and the third layer 130a component of the plastic member illustrated in FIG. 8 may be different from the plastic member illustrated in the FIG. 7, but the rest of the plastic member of FIG. 8 may be the same as that of the plastic member of FIG. 7. Hereinafter the difference from the plastic member of FIG. 7 will be mainly described, and a description of the same configuration will be omitted.

The plastic object 100a may be smoother without a foreign substance due to a plasma treatment, and provided in a planar shape or in a curved shape.

The first layer 110a may include an inorganic material, e.g. silicon nitride ($Si_3N_4$) or silicon dioxide ($SiO_2$), and may include at least one selected from a group consisting of aluminum nitride (AlN), chromium nitride (CrN), titanium nitride (TiN), aluminum oxide ($Al_2O_3$), chromium oxide ($Cr_2O_3$), and titanium oxide ($Ti_2O_3$). The first layer 110a may be provided to implement various colors in addition to a color of metal, and interference patterns caused by reflection of light may be adjusted by adjusting wavelength of a thin film thickness, thereby implementing various colors.

The second layer 120a may include at least one selected from a group consisting of gold (Au), silver (Ag), aluminum (Al), chromium (Cr), titanium (Ti), and Tin (Sn). The second layer 120a may be provided to implement metal features in the plastic object 100a, and elements thereof are not limited by the above-described examples. Therefore, the second layer 120a may include a material having high reflectivity within the scope, which is easy to be facilitated by those of skilled in the art.

The third layer 130a may include an inorganic material, e.g. silicon nitride ($Si_3N_4$) or silicon dioxide ($SiO_2$), and may include at least one selected from a group consisting of aluminum nitride (AlN), chromium nitride (CrN), titanium nitride (TiN), aluminum oxide ($Al_2O_3$), chromium oxide ($Cr_2O_3$), and titanium oxide ($Ti_2O_3$). The third layer 130a may be provided to include the same component as the first layer 110a. The third layer 130a may be provided to implement various colors in addition to a color of metal, and interference patterns caused by reflection of light may be adjusted by adjusting wavelength of a thin film thickness, thereby implementing various colors.

The plastic member may be formed in a way that the first layer 110a and the third layer 130a, in which plasma treatment is performed to allow a metal to be coupled to nitrogen ($N_2$) and oxygen ($O_2$), are formed on at opposite sides of the second layer 120a having metal features, and thus the plastic member may have a non-conductive surface. Accordingly, the plastic member may have non-conductive surface so that the wireless communication quality and sensing quality in a plastic member and an electronic product including a wireless communication device or a sensor may be improved.

Next, a plastic member manufactured by the multilayer thin film manufacturing device 200b of FIG. 5 will be described with reference to FIG. 9.

Figure 9:
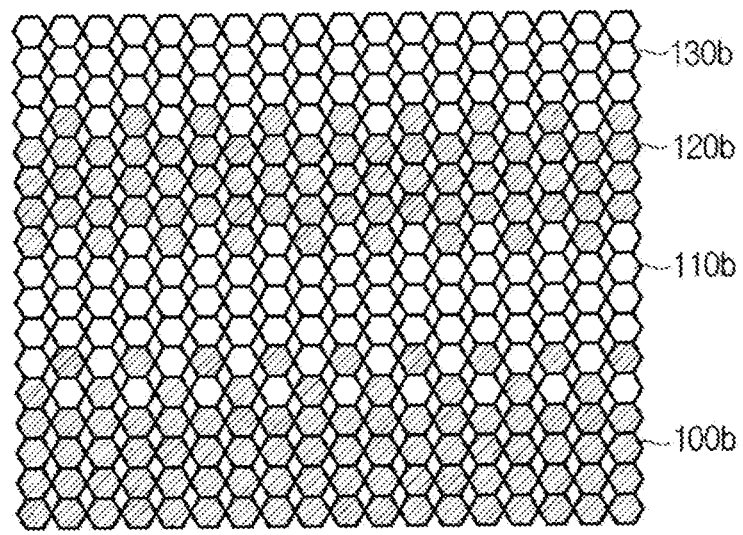
FIG. 9 is a view illustrating a structure of multilayer thin film deposited by the device of FIG. 5.

FIG. 9 is a view illustrating a structure of a plastic member according to an exemplary embodiment of the present disclosure. As illustrated in FIG. 9, the plastic member may include a first layer 110b deposited on a plastic object 100b, a second layer 120b deposited on the first layer 110b, and a third layer 130b deposited on the second layer 120b. The first layer 110b component and the third layer 130b component of the plastic member illustrated in FIG. 9 may be different from those of the plastic member illustrated in the FIG. 7, but the rest of the plastic member of FIG. 9 may be the same as that of the plastic member of FIG. 7. Hereinafter the difference from the plastic member of FIG. 7 will be mainly described, and a description of the same configuration will be omitted.

The plastic object 100b may be smoother without a foreign substance due to a plasma treatment, and provided in a planar shape or in a curved shape.

The first layer 110b may include an inorganic material, e.g. silicon nitride ($Si_3N_4$) or silicon dioxide ($SiO_2$). The first layer 110b may be provided to implement various colors in addition to a color of metal, and interference patterns caused by reflection of light may be adjusted by adjusting wavelength of a thin film thickness, thereby implementing various colors.

The second layer 120b may include at least one selected from a group consisting of gold (Au), silver (Ag), aluminum (Al), chromium (Cr), titanium (Ti), and Tin (Sn). The second layer 120b may be provided to implement metal features in the plastic object 100b, and elements thereof are not limited by the above-described examples. Therefore, the second layer 120b may include a material having high reflectivity within the scope, which is easy to be facilitated by those of skilled in the art.

The third layer 130b may include an inorganic material, e.g. silicon nitride ($Si_3N_4$) or silicon dioxide ($SiO_2$). The third layer 130b may be provided to include the same component as the first layer 110b. The third layer 130b may be provided to implement various colors in addition to a color of metal, and interference patterns caused by reflection of light may be adjusted by adjusting wavelength of a thin film thickness, thereby implementing various colors.

The plastic member may be formed in a way that the first layer 110b and the third layer 130b, in which plasma treatment is performed to allow a metal to include an inorganic material, are formed at opposite sides of the second layer 120b having metal features, and thus the plastic member may have a non-conductive surface. Accordingly, the plastic member may have non-conductive surface so that the wireless communication quality and sensing quality in a plastic member and an electronic product including a wireless communication device or a sensor may be improved.

Next, an electronic product to which the method of manufacturing the multilayer thin film and the plastic members described above are applied will be described.

The electronic product may include a housing and a multilayer thin film coupled to all or a part of a surface of the housing. The multilayer thin film may implement a deep metal sense on a surface of a plastic housing, and the same structure as the above-described structures may be applied to the multilayer thin film.

For example, the multilayer thin film according to an exemplary embodiment may be coupled to all or a part of the surface of the housing, and may include a first layer 110, a second layer 120 coupled to the first layer 110, and a third layer 130 coupled to the second layer 120, as illustrated in FIG. 7. In addition, a multilayer thin film included in an electronic product may include a first layer 110a, a second layer 120a coupled to the first layer 110a, and a third layer 130a coupled to the second layer 120a, as illustrated in FIG. 8, and alternatively, the multilayer thin film may include a first layer 110b, a second layer 120b coupled to the first layer 110b, and a third layer 130b coupled to the second layer 120b, as illustrated in FIG. 9. A repeated description related to the structure of the multilayer thin film and components thereof as illustrated in FIGS. 7 to 9 will be omitted. Hereinafter, for convenience of description, a plurality of electronic products including the multilayer thin film illustrated in FIG. 7 will be described. It may be understood that the multilayer thin film of FIG. 8 and the multilayer thin film of FIG. 9 may be provided to aforementioned electronic product.

As the housing is a part, such as a case which accommodates a part, a frame containing an apparatus, or the like, surrounding all mechanical devices in a box shape, the housing may include accessories. In addition, an accessory of the housing may be defined as a concept including a part of the housing which forms an exterior, such as a bezel unit of a TV, a stand of the TV, a bezel unit of a communication device, or a concept including a part of an electronic product.

Hereinafter, an electronic product according to an exemplary embodiment will be described in detail with reference to the accompanying drawings.

Figure 10:
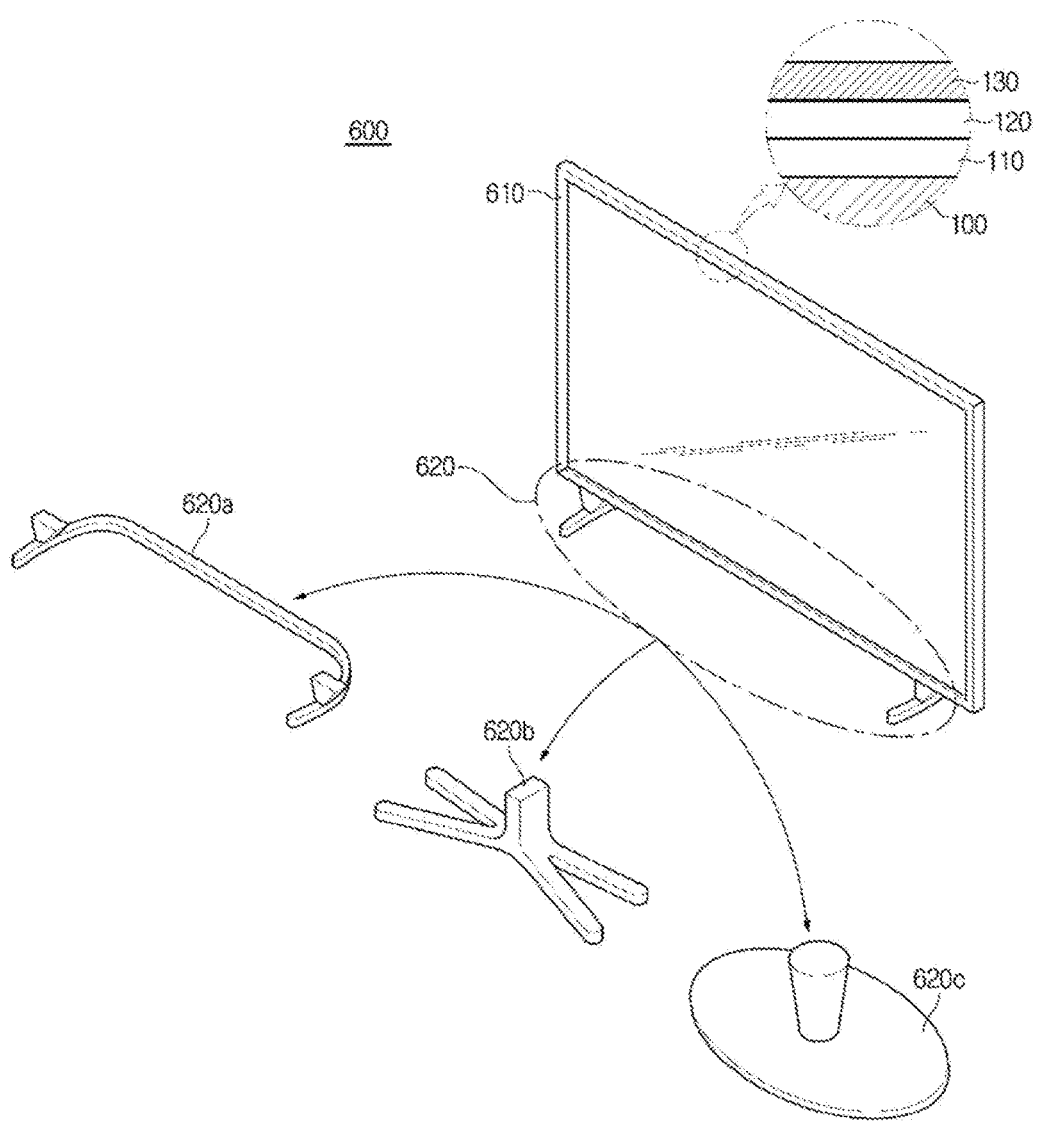
FIG. 10 is a view of a television (TV) with an exterior formed by a housing on which multilayer thin film illustrated in FIG. 7 is deposited on a surface thereof, as an example of an electronic product according to an exemplary embodiment of the present disclosure.

FIG. 10 is a view of a television (TV) 600 with an exterior formed by a housing on which multi-layer thin film illustrated in FIG. 7, is deposited on a surface thereof, as an example of an electronic product according to an exemplary embodiment of the present disclosure.

The multilayer thin film may include a first layer 110, a second layer 120, and a third layer 130.

The TV 600 may include a bezel unit 610 in which the multilayer thin film is formed and a stand 620 including stand units 620a, 620b, and 620c in which the multilayer thin film is formed. The multilayer thin film formed on the bezel unit 610 and the stand units 620a, 620b, and 620c may be non-conductive so that the sensing efficiency of a sensor provided on the TV 600 may be improved. In addition, the multilayer thin film formed on the bezel unit 610 and the stand units 620a, 620b, and 620c may improve the wireless communication efficiency of wireless communication device provided in the TV 600.

Figure 11:
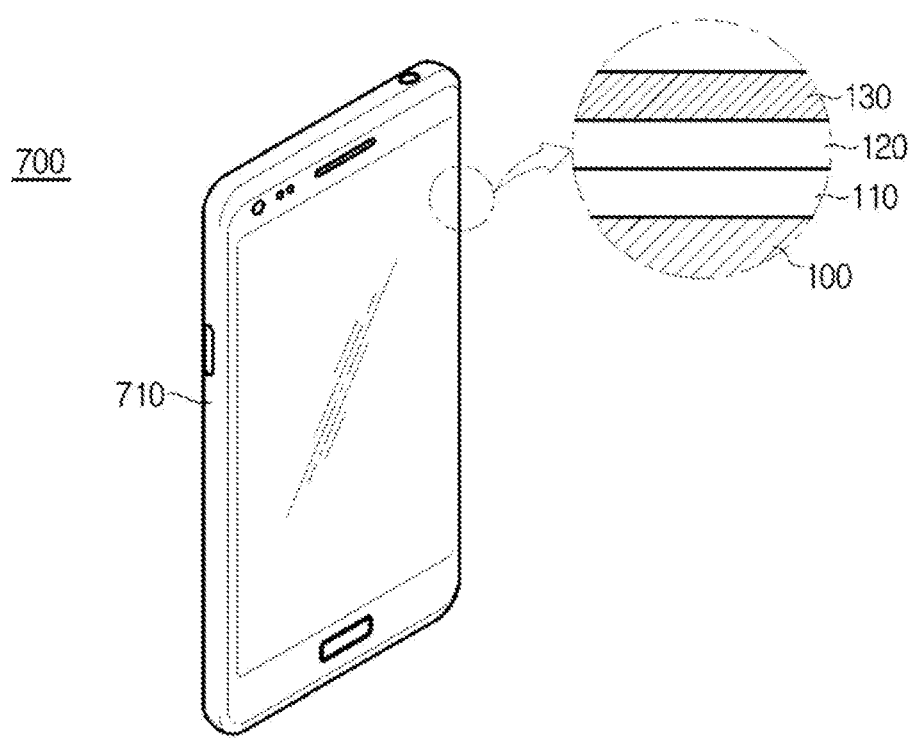
FIG. 11 is a perspective view of a communication device including a housing on which multilayer thin film illustrated in FIG. 7 is deposited on a surface thereof, as an example of an electronic product according to an exemplary embodiment of the present disclosure
Figure 12:
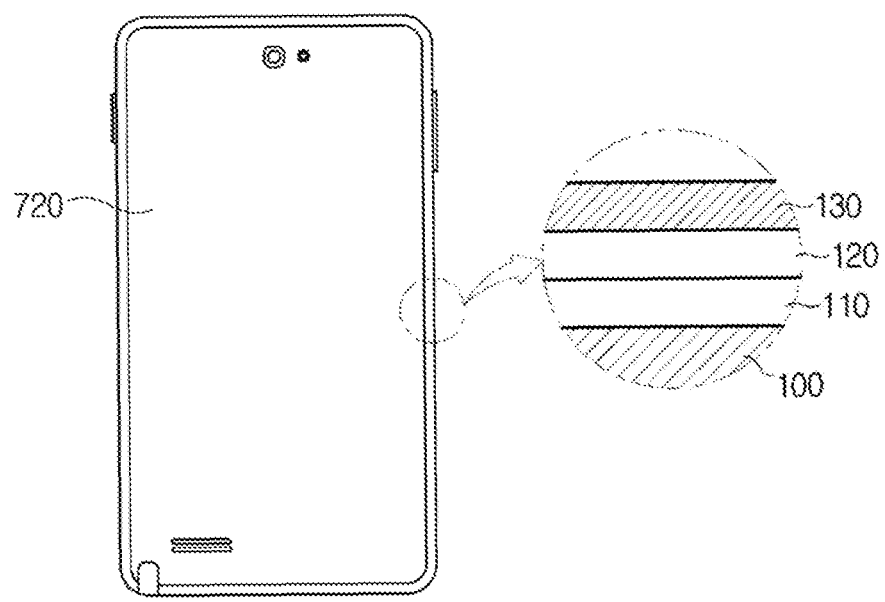
FIG. 12 is a rear view thereof.

FIG. 11 is a perspective view of a communication device 700 including a housing on which multi-layer thin film illustrated in FIG. 7 is deposited on a surface thereof, as an example of an electronic product according to an exemplary embodiment of the present disclosure and FIG. 12 is a rear view illustrating a rear side of FIG. 11.

The multilayer thin film may include a first layer 110, a second layer 120, and a third layer 130.

An exterior of the communication device 700 may be formed by the housing. It may be understood that the housing including a bezel unit 710 of the communication device 700 and a case unit 720 of the communication device 700 is a broad concept. The multilayer thin film formed on the housing may be provided as non-conductive so that the wireless communication efficiency of the communication device 700 may be improved. In addition, the multilayer thin film formed on the housing may improve the sensing efficiency of the sensor provided in the communication device 700.

Figure 13:
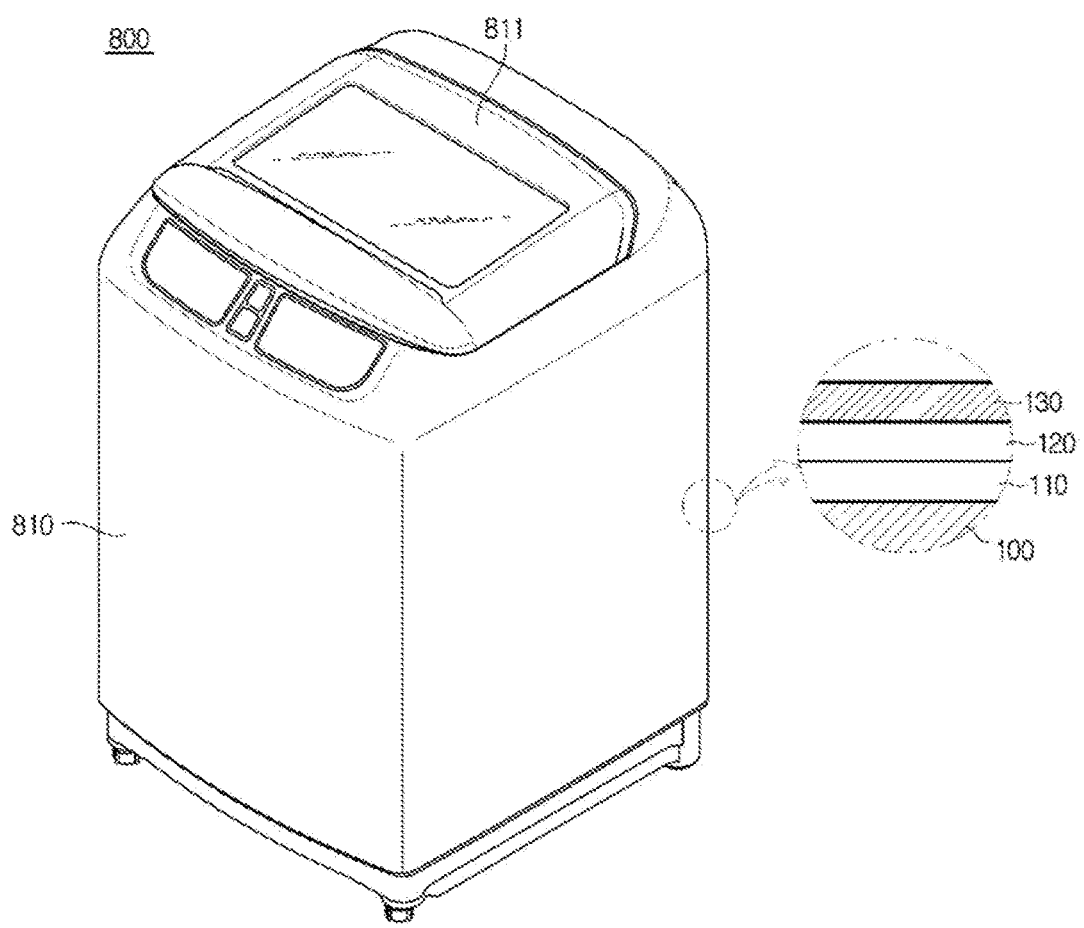
FIG. 13 is a view of a washing machine with an exterior formed by a housing on which multi-layer thin film illustrated in FIG. 7 is deposited on a surface thereof, as an example of an electronic product according to an exemplary embodiment of the present disclosure.

FIG. 13 is a view of a washing machine 800 with an exterior formed by a housing on which multi-layer thin film illustrated in FIG. 7 is deposited on a surface thereof, as an example of an electronic product according to an exemplary embodiment of the present disclosure.

The multilayer thin film may include a first layer 110, a second layer 120, and a third layer 130.

An exterior of the washing machine 800 may be formed by a housing 810, and the washing machine 800 may be openable by a door 811 provided on an upper portion thereof. It may be understood that the housing 810 including the door 811 is a broad concept, and the multilayer thin film formed on the housing 810 may be provided as non-conductive so that the sensing efficiency of sensor provided in the washing machine 800 may be improved. In addition, the multilayer thin film formed on the housing 810 may improve the wireless communication efficiency of the wireless communication device provided on the washing machine 800.

Figure 14:
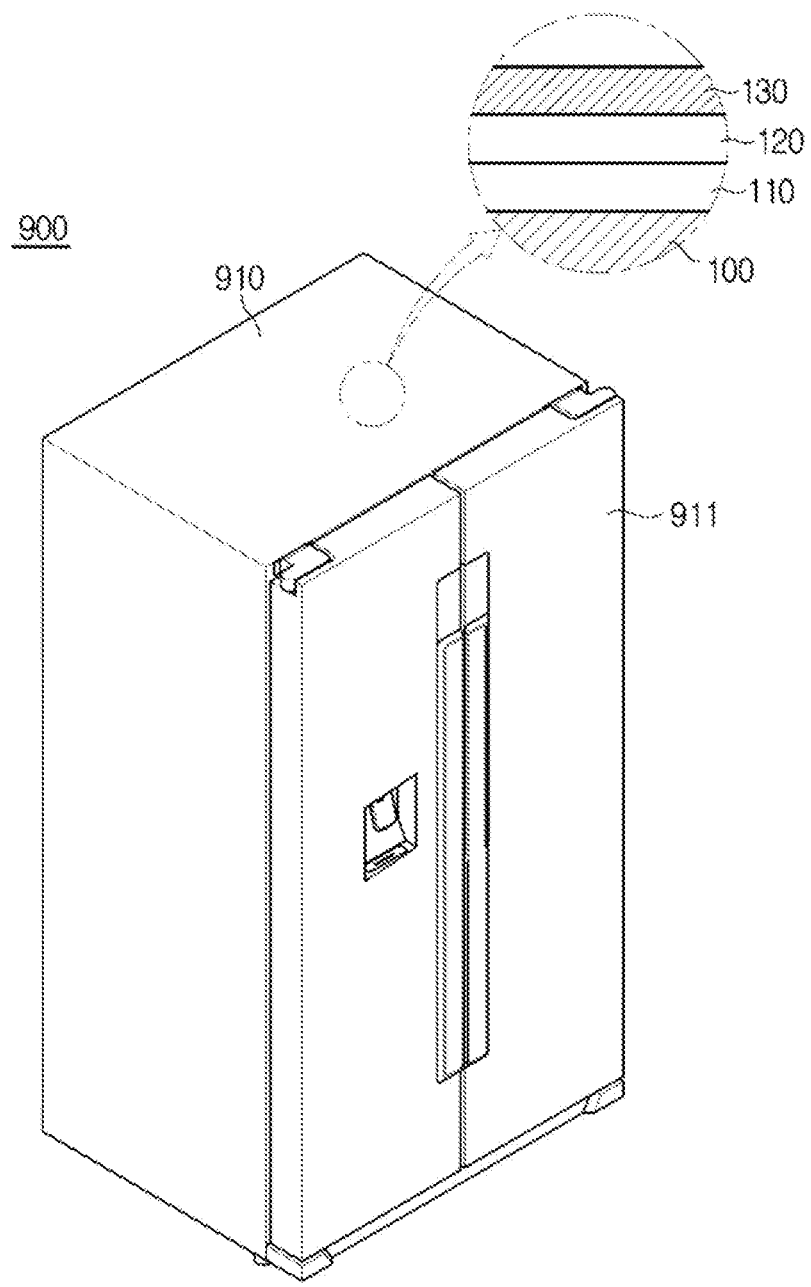
FIG. 14 is a view of a refrigerator with an exterior formed by a housing on which multi-layer thin film illustrated in FIG. 7 is deposited on a surface thereof, as an example of an electronic product according to an exemplary embodiment of the present disclosure.

FIG. 14 is a view of a refrigerator 900 with an exterior formed by a housing on which multi-layer thin film illustrated in FIG. 7 is deposited on a surface thereof, as an example of an electronic product according to an exemplary embodiment of the present disclosure.

The multilayer thin film may include a first layer 110, a second layer 120, and a third layer 130.

An exterior of the refrigerator 900 may be formed by a housing 910, and the refrigerator 900 may be openable by a door 911 provided on a front surface thereof. It may be understood that the housing 910 including the door 911 is a broad concept, and the multilayer thin film formed on the housing 910 may be provided as non-conductive so that the sensing efficiency of sensor provided in the refrigerator 900 may be improved. In addition, the multilayer thin film formed on the housing 910 may improve the wireless communication efficiency of the wireless communication device provided on the refrigerator 900.

As is apparent from the above description, according to the proposed multilayer thin film, the method of manufacturing the same, and the electronic product including the same, a non-conductive multilayer thin film may be formed on a surface of the housing of the electronic product.

In addition, the wireless communication quality and the sensing quality may be improved due to a non-conductive multilayer thin film formed on a surface of the housing of the electronic product.

In addition, a surface of the housing of the electronic product may be formed by a multilayer thin film having a non-conductive and a variety of colors.

In addition, the metal sense may be implemented by a pure dry method by using a sputtering deposition device, and thus a multilayer thin film may be formed eco-friendly.

Although a few exemplary embodiments of the present disclosure have been shown and described, it would be appreciated by those skilled in the art that changes may be made in these exemplary embodiments without departing from the principles and spirit of the disclosure, the scope of which is defined in the claims and their equivalents.

What is claimed is:

1. A multilayer thin film comprising:
a first layer including a non-conductive material, the first layer being coupled to an object;
a second layer including a metallic material, the second layer being coupled to the first layer; and
a third layer including a non-conductive material, the third layer being coupled to the second layer,
wherein the third layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), and titanium oxide ($Ti_2O_3$).

2. The multilayer thin film of claim 1, wherein the first layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

3. The multilayer thin film of claim 1, wherein the second layer comprises at least one selected from the group consisting of aluminum (Al), chromium (Cr), titanium (Ti), and silicon (Si).

4. The multilayer thin film of claim 1, wherein the first layer, the second layer, and the third layer are deposited by being plasma-processed, respectively.

5. A method of manufacturing of a multilayer thin film comprising:
depositing a first layer on an object, the first layer being non-conductive;
depositing a second layer on the first layer, the second layer being metallic; and
depositing a third layer on the second layer, the third layer being non-conductive, by providing a third target sample including at least one selected from a group consisting of aluminum (Al), chromium (Cr), titanium (Ti), and silicon (Si) in a multilayer thin film manufacturing device.

6. The method of claim 5, wherein the depositing the third layer on the second layer comprises:
injecting a reaction gas including nitrogen ($N_2$) and oxygen ($O_2$) into the multilayer thin film manufacturing device,
applying a power source to the multilayer thin film manufacturing device, and
reacting the target sample with the reaction gas.

7. The method of claim 6, wherein the depositing the first layer on the object comprises:
providing a first target sample including at least one selected from a group consisting of aluminum (Al), chromium (Cr), titanium (Ti), and silicon (Si) in the multilayer thin film manufacturing device,
injecting the reaction gas including nitrogen ($N_2$) and oxygen ($O_2$) into the multilayer thin film manufacturing device,
applying the power source to the multilayer thin film manufacturing device, and reacting the target sample with the reaction gas.

8. The method of claim 7, wherein the depositing the second layer on the first layer comprises:
providing a second target sample including at least one selected from the group consisting of aluminum (Al), chromium (Cr), titanium (Ti), and silicon (Si) in the multilayer thin film manufacturing device, and
applying the power source to the multilayer thin film manufacturing device.

9. The method of claim 8, wherein the second layer comprises at least one selected from the group consisting of aluminum (Al), chromium (Cr), titanium (Ti), and silicon (Si).

10. The method of claim 7, wherein the first layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

11. The method of claim 7, wherein the providing the target sample comprises:
providing a first target sample including at least one selected from a group consisting of aluminum (Al), chromium (Cr), and titanium (Ti) in the multilayer thin film manufacturing device, and
providing a second target sample comprising silicon (Si) in the multilayer thin film manufacturing device.

12. The method of claim 6, wherein the third layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

13. The method of claim 5 further comprising modifying a surface of the object by a plasma treatment, wherein the object t is a plastic material.

14. The method of claim 13, wherein the modifying the surface of the object by the plasma treatment is performed prior to the depositing the first layer on the object.

15. An electronic product comprising:
a housing; and
a multilayer thin film coupled to a part of a surface of the housing,
wherein the multilayer thin film comprises a first layer coupled to the housing, a second layer coupled to the first layer, and a third layer coupled to the second layer, and
wherein the first layer comprises a non-conductive material,
wherein the second layer is metallic, and
wherein the third layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), and titanium oxide ($Ti_2O_3$).

16. The electronic product of claim 15, wherein the first layer comprises at least one selected from the group consisting of aluminum nitride (AlN), chromium nitride (CrN), titanium nitride (TiN), aluminum oxide ($Al_2O_3$), chromium oxide ($Cr_2O_3$), silicon nitride ($Si_3N_4$), silicon dioxide ($SiO_2$), and titanium oxide ($Ti_2O_3$).

17. The electronic product of claim 15, wherein the second layer comprises at least one selected from the group consisting of aluminum (Al), chromium (Cr), titanium (Ti), and silicon (Si).

18. The electronic product of claim 15, wherein the first layer, the second layer, and the third layer are deposited by being plasma-processed, respectively.

* * * * *